(12) United States Patent
Yang et al.

(10) Patent No.: US 12,272,623 B2
(45) Date of Patent: Apr. 8, 2025

(54) SEMICONDUCTOR PACKAGES AND METHODS FOR FORMING THE SAME

(71) Applicant: TAIWAN SEMICONDUCTOR MANUFACTURING COMPANY, LTD., Hsinchu (TW)

(72) Inventors: Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/230,284

(22) Filed: Aug. 4, 2023

(65) Prior Publication Data

US 2023/0378030 A1 Nov. 23, 2023

Related U.S. Application Data

(62) Division of application No. 17/367,530, filed on Jul. 5, 2021, now Pat. No. 11,854,944.

(Continued)

(51) Int. Cl.
*H01L 21/00* (2006.01)
*H01L 23/48* (2006.01)
(Continued)

(52) U.S. Cl.
CPC ........ *H01L 23/4822* (2013.01); *H01L 23/481* (2013.01); *H01L 23/5286* (2013.01);
(Continued)

(58) Field of Classification Search
CPC ............... H01L 23/4822; H01L 23/481; H01L 23/5286; H01L 25/0652
See application file for complete search history.

(56) References Cited

U.S. PATENT DOCUMENTS

| 8,802,504 B1 | 8/2014 | Hou et al. |
| 8,803,292 B2 | 8/2014 | Chen et al. |

(Continued)

FOREIGN PATENT DOCUMENTS

| CN | 114823621 | 7/2022 | |
| CN | 114823621 A | * 7/2022 | ............. H01L 21/56 |

(Continued)

*Primary Examiner* — Laura M Menz
(74) *Attorney, Agent, or Firm* — NZ Carr Law Office

(57) ABSTRACT

Embodiments of the present disclosure provide a stacking edge interconnect chiplet. In one embodiment, a semiconductor device is provided. The semiconductor device includes a first integrated circuit die comprising a first device layer having a first side and a second side opposite the first side, a first interconnect structure disposed on the first side of the first device layer, and a second interconnect structure disposed on the second side of the first device layer. The semiconductor device also includes a power line extending through the first device layer and in contact with the first interconnect structure and the second interconnect structure, and a second integrated circuit die disposed over the first integrated circuit die, the second integrated circuit die comprising a third interconnect structure in contact with the second interconnect structure of the first integrated circuit die.

20 Claims, 23 Drawing Sheets

Related U.S. Application Data

(60) Provisional application No. 63/166,466, filed on Mar. 26, 2021.

(51) Int. Cl.
  *H01L 23/482* (2006.01)
  *H01L 23/528* (2006.01)
  *H01L 25/00* (2006.01)
  *H01L 25/065* (2023.01)
  *H01L 29/06* (2006.01)
  *H01L 29/423* (2006.01)
  *H01L 29/786* (2006.01)

(52) U.S. Cl.
  CPC .......... *H01L 25/0652* (2013.01); *H01L 25/50* (2013.01); *H01L 29/0665* (2013.01); *H01L 29/42392* (2013.01); *H01L 29/78696* (2013.01)

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 * | 9/2016 | Lin | H01L 21/563 |
| 9,496,189 B2 * | 11/2016 | Yu | H01L 22/20 |
| 11,594,524 B2 * | 2/2023 | Mueller | H01L 21/76251 |
| 11,728,273 B2 * | 8/2023 | Haba | H01L 25/50 257/777 |
| 11,854,944 B2 * | 12/2023 | Yang | H01L 29/78696 |
| 12,094,848 B2 * | 9/2024 | Yang | H01L 24/24 |
| 12,125,798 B2 * | 10/2024 | Yu | H01L 23/5384 |
| 12,142,528 B2 * | 11/2024 | DeLaCruz | H01L 24/26 |
| 2022/0077063 A1 * | 3/2022 | Haba | H01L 25/0655 |
| 2022/0285292 A1 * | 9/2022 | Shue | H01L 21/78 |
| 2022/0285318 A1 * | 9/2022 | Yang | H01L 23/544 |
| 2022/0293527 A1 * | 9/2022 | Lee | H01L 23/49833 |
| 2022/0293546 A1 * | 9/2022 | Yang | H01L 24/19 |
| 2022/0310489 A1 * | 9/2022 | Yang | H01L 21/6835 |
| 2022/0352082 A1 * | 11/2022 | Yu | H01L 23/5386 |
| 2022/0367435 A1 * | 11/2022 | Hung | H01L 25/18 |
| 2023/0378030 A1 * | 11/2023 | Yang | H01L 21/6835 |
| 2024/0038605 A1 * | 2/2024 | Chiu | H01L 22/32 |
| 2024/0071941 A1 * | 2/2024 | Chen | H01L 23/5386 |
| 2024/0087990 A1 * | 3/2024 | Yang | H01L 23/5286 |
| 2024/0096951 A1 * | 3/2024 | Mukesh | H01L 27/0688 |
| 2024/0170406 A1 * | 5/2024 | Haba | H01L 25/0655 |
| 2024/0186248 A1 * | 6/2024 | Haba | H01L 23/49822 |

FOREIGN PATENT DOCUMENTS

| | | | | |
|---|---|---|---|---|
| CN | 114823622 | | 7/2022 | |
| CN | 114823622 A | * | 7/2022 | ............. H01L 22/10 |
| CN | 114823623 | | 7/2022 | |
| CN | 114823623 A | * | 7/2022 | ......... H01L 23/3107 |
| CN | 114823624 | | 7/2022 | |
| CN | 114823624 A | * | 7/2022 | ............. H01L 23/481 |
| CN | 114883294 | | 8/2022 | |
| CN | 114883294 A | * | 8/2022 | ......... H01L 21/6835 |
| CN | 115101493 A | * | 9/2022 | ............. H01L 21/78 |
| TW | 202236575 A | * | 9/2022 | ............. H01L 21/56 |
| WO | 2017111792 | | 6/2017 | |
| WO | WO-2017111792 A1 | * | 6/2017 | ......... H01L 21/486 |
| WO | WO-2024118821 A1 | * | 6/2024 | ......... H01L 23/367 |

* cited by examiner

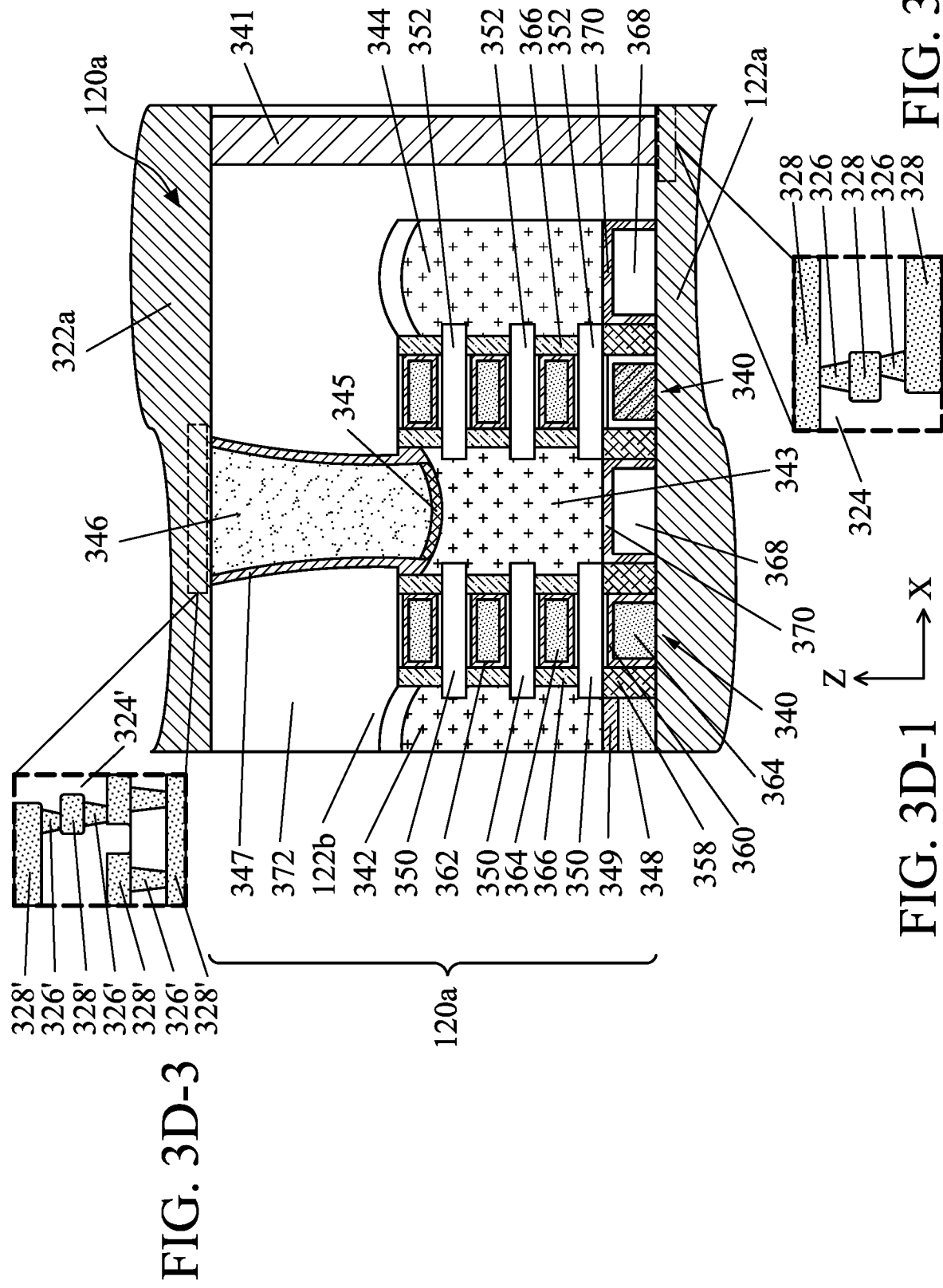

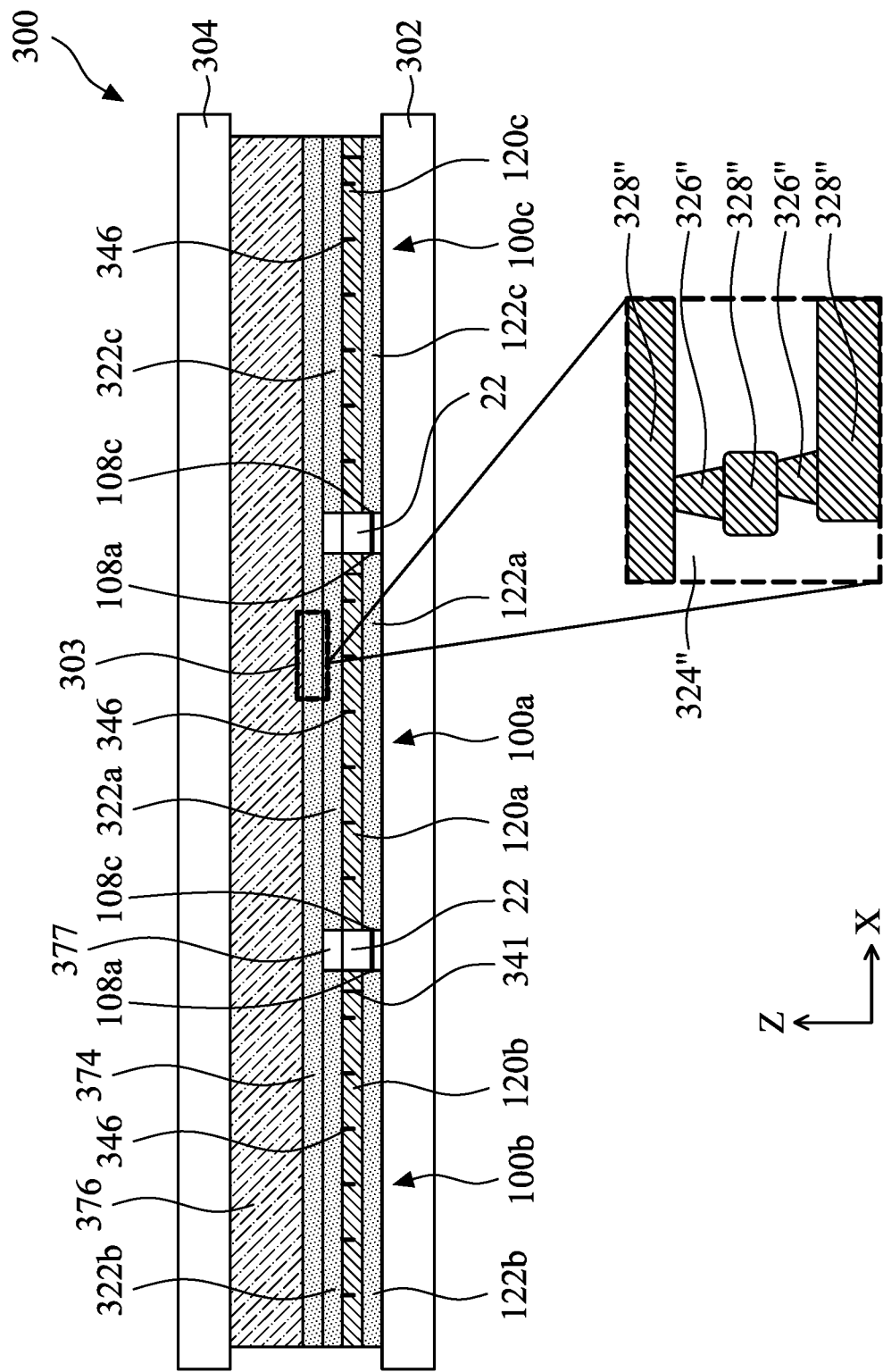

SEMICONDUCTOR PACKAGES AND METHODS FOR FORMING THE SAME

CROSS-REFERENCE TO RELATED APPLICATIONS

This application is a divisional application of U.S. patent application Ser. No. 17/367,530 filed on Jul. 5, 2021, which claims priority to a U.S. provisional patent application Ser. No. 63/166,466 filed on Mar. 26, 2021, which are incorporated by reference in their entirety.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3G schematically demonstrate various stages of forming a semiconductor package according to embodiments of the present disclosure.

FIG. 3D-1 illustrates an enlarged view of a portion of the device layer shown in FIG. 3D according to embodiments of the present disclosure.

FIGS. 3D-2 and 3D-3 show an enlarged view of a portion of the interconnect structures and the backside interconnect structures, respectively, in accordance with some embodiments.

FIG. 3E-1 shows an enlarged view of a portion of the interconnect structure in accordance with some embodiments.

DETAILED DESCRIPTION

Figure 1A:
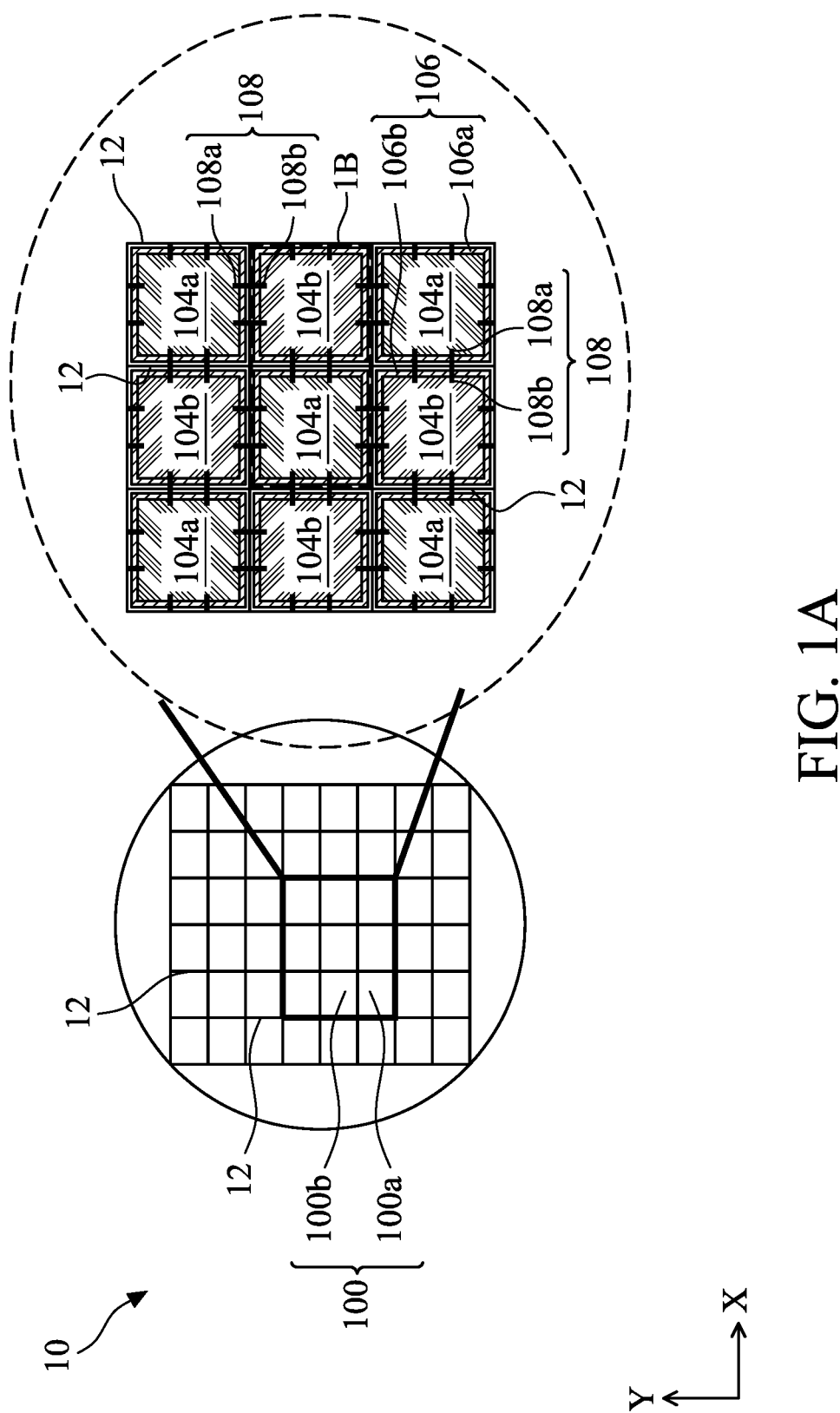
FIG. 1A is a schematic plan view of a substrate including an array of integrated circuit dies according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding. For example, by including a solder bonding (instead of, for example, copper to copper bonding), the bonding temperature of the hybrid bonding can be lowered significantly.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

Figure 1B:
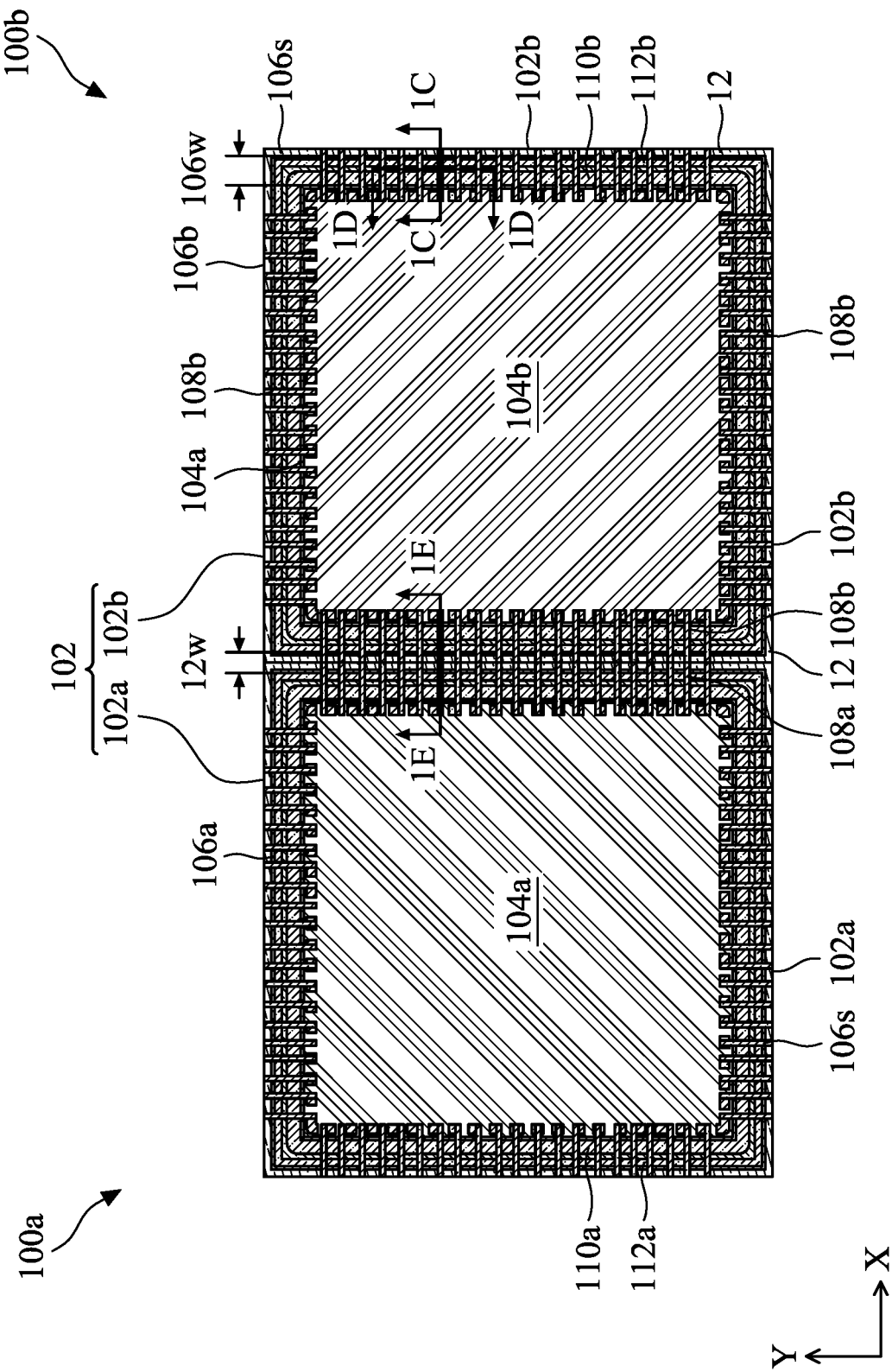
FIG. 1B is a schematic plan view of two neighboring integrated circuit dies according to embodiments of the present disclosure.
Figure 1C:
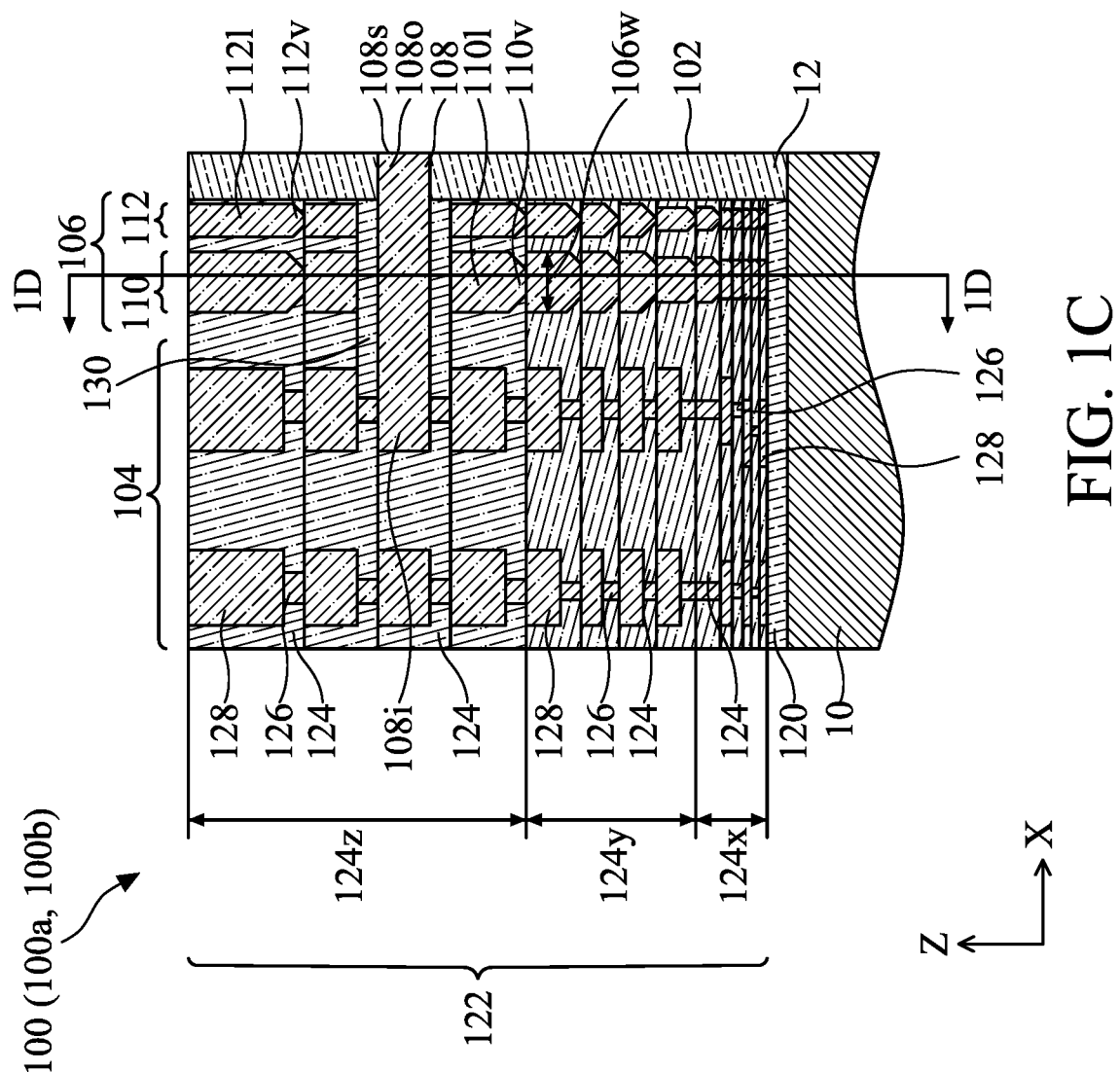
FIG. 1C is an enlarged partial sectional view of the integrated circuit die along the line 1C-1C in FIG. 1B.
Figure 1D:
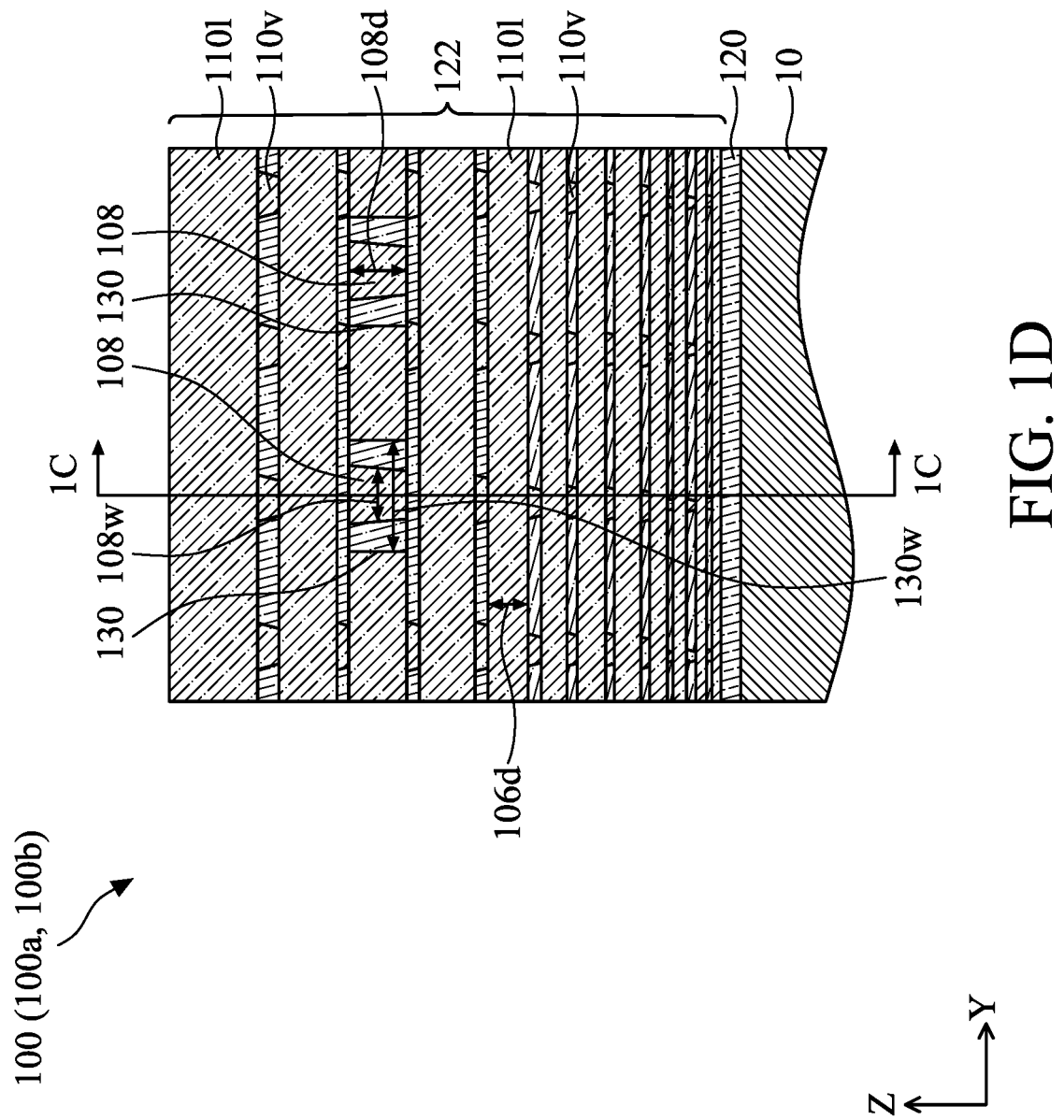
FIG. 1D is an enlarged partial sectional view of the integrated circuit die along the line 1D-1D in FIG. 1C.
Figure 1E:
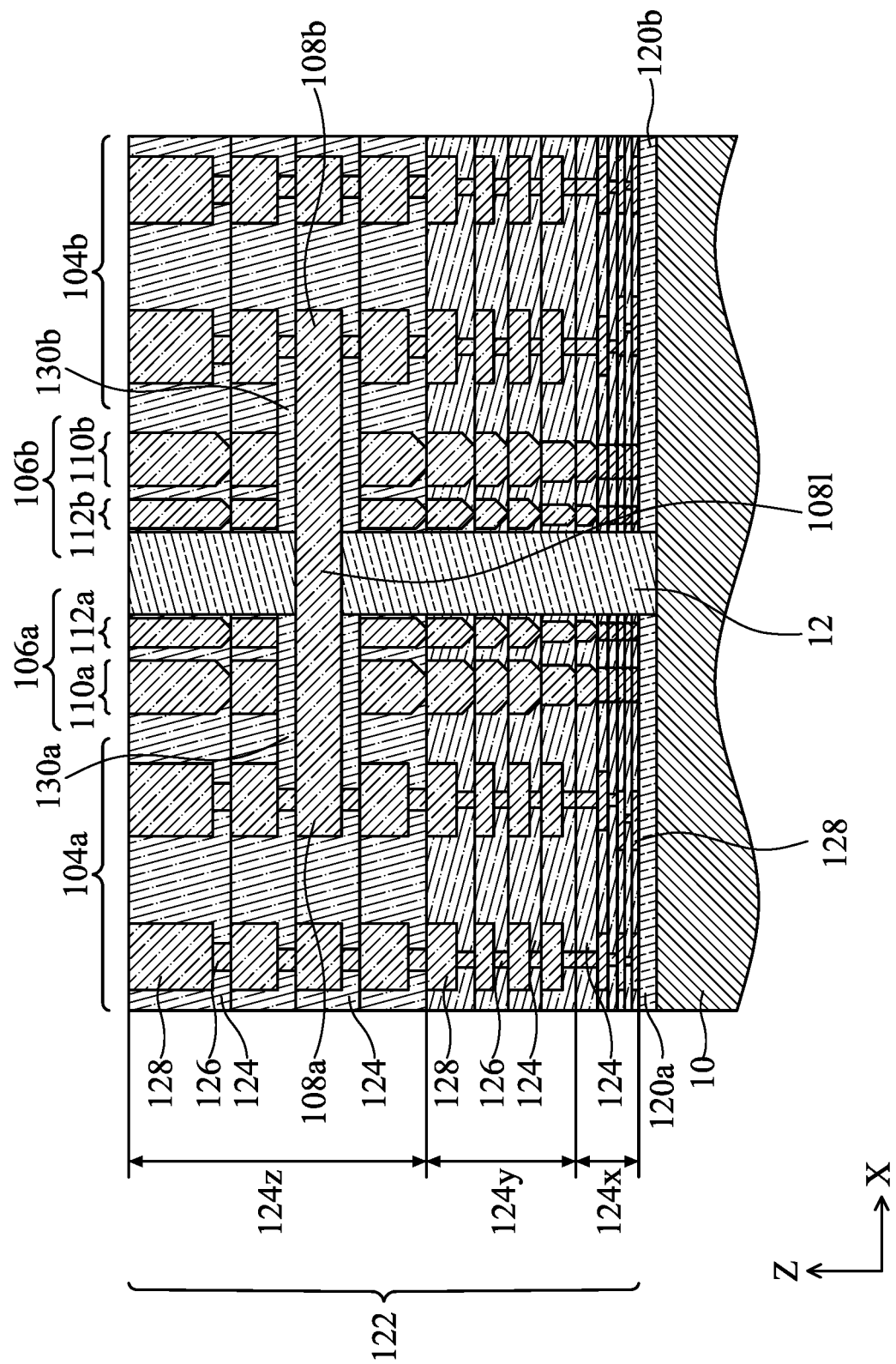
FIG. 1E is an enlarged partial sectional view of the neighboring integrated circuit die along the line 1E-1E in FIG. 1B.

FIGS. 1A-1K schematically demonstrate an integrated circuit die having edge interconnect features according to embodiments of the present disclosure. FIG. 1A is a schematic plan view of a substrate 10 including an array of integrated circuit dies 100 according to embodiments of the present disclosure. FIG. 1B is a schematic plan view of two neighboring integrated circuit dies 100 (100a, 100b) according to embodiments of the present disclosure. FIG. 1C is an enlarged partial sectional view of the integrated circuit die 100 along the line 1C-1C in FIG. 1B. FIG. 1D is an enlarged partial sectional view of the integrated circuit die 100 along the line 1D-1D in FIG. 1C. FIG. 1E is an enlarged partial sectional view of the neighboring integrated circuit die 100a, 100b along the line 1E-1E in FIG. 1B.

As shown in FIG. 1A, an array of integrated circuit dies (or chiplets) 100 are formed on the substrate 10. The array of integrated circuit dies 100 are separated from each other by two sets of intersecting scribe lines 12. A first set of scribe lines 12 extend along the x-direction and a second set of scribe lines 12 extend along the y-direction. The array of integrated circuit dies 100 are formed in and/or on the substrate 10 within an array of areas defined by the scribe lines 12. In some embodiments, the integrated circuit dies 100 including two or more different circuit designs. After fabrication, the integrated circuit dies 100 may be tested and cut out along the scribe lines 12 to individual integrated circuit dies 100 or various combination of neighboring integrated circuit dies 100 for subsequent processing, such as packaging.

As shown in FIG. 1A, the plurality of integrated circuit dies 100 fabricated in and/or on the substrate 10 include two types of integrated circuit dies 100a, 100b. The integrated circuit dies 100a, 100b may have substantially the same dimension but with different circuit designs to achieve different functions. In some embodiments, the integrated circuit dies 100a, 100b are arranged alternatively so that each of the integrated circuit die 100a is bordered by at least one integrated circuit die 100b. Neighboring integrated circuit dies 100a, 100b are connected through edge interconnect features, as will be discussed in more detail below.

In one embodiment shown in FIG. 1A, each of the integrated circuit dies 100 (100a, 100b) may include a circuit region 104 (104a, 104b) surrounded by a seal region 106 (106a, 106b). In various embodiments of the present disclosure, the integrated circuit die 100 (100a, 100b) includes one or more edge interconnect features 108 (108a, 108b) extending from the circuit region 104 (104a, 104b) through the seal region 106 (106a, 106b) into the scribe line 12. In some embodiments, the edge interconnect features 108 may be conductive lines intersecting with the scribe lines 12 surrounding the integrated circuit die 100 (100a, 100b). After the integrated circuit die 100 (100a, 100b) is cut out along the scribe lines 12, the edge interconnect features 108 (108a, 108b) are exposed on cutting surfaces 102 (102a, 102b) (see FIG. 1B) of the integrated circuit die 100 (100a, 100b). The edge interconnect features 108 (108a, 108b) may be conductive lines configured to connect with external contacts formed on the cutting surfaces 102 (102a, 102b) to provide signal and/or power supplies.

In some embodiments, the edge interconnect features 108 (108a, 108b) may be symmetrically arranged across all scribe lines 12 around the integrated circuit die 100 (100a, 100b). The symmetrical arrangement provides high feasibility for circuit designers. One connection protocol for the edge interconnect features may be used in different integrated circuit dies, thus, facilitating fabrication of two or more directly connected integrated circuit dies on one substrate. For example, in FIG. 1A, a plurality of pairs of directly connected integrated circuit dies 100a, 100b are fabricated in and on the substrate 10. In some embodiments, individual integrated circuit dies 100a, 100b may be tested before cutting. The integrated circuit dies 100a, 100b may be cut into various die combinations. Each die combination may include the integrated circuit dies 100a, 100b of different arrangements and directly packaged as connected components for lowering cost of production. Conductive features may be formed from the exposed edge interconnect features 108 to connect with other integrated circuit dies without going through an interposer.

The substrate 10 may be a semiconductor substrate, for example, bulk silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as a multi-layered or gradient substrate may also be used.

The array of integrated circuit dies 100 may be formed in and/or on the substrate 10 by performing various semiconductor fabrication processes, including, but not limited to, front-end-of-line (FEOL) processing and back-end-of-line (BEOL) processing. As shown in FIGS. 1C to 1K, various semiconductor fabrication processes are performed to form a device layer 120 (120a, 120b) and an interconnect structure 122 (122a, 122b) in the integrated circuit dies 100 (100a, 100b).

In some embodiments, the array of integrated circuit dies 100 may include two or more different circuit designs formed on the same substrate 10 to achieve direct heterogenous connections between the integrated circuit dies 100. In other embodiments, the array of integrated circuit dies 100 have substantially identical circuit designs, which may be cut off individually to be connected to other circuit components through the edge interconnect features 108.

The integrated circuit dies 100 may be designed to perform any suitable function. For example, the integrated circuit die 100 may be a logic die (e.g., central processing unit, a SoC, ASIC, FPGA, microcontroller, etc.), a memory die (e.g., a DRAM die, a Wide I/O die, a M-RAM die, a R-RAM die, a NAND die, an SRAM die, etc.), a memory cube (e.g., HBM, HMC, etc.), a high data rate transceiver die, an I/O interface die, an integrated passive device die (e.g., an IPD die), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, the like, or any combinations thereof.

FIG. 1B is a schematic plan view of two neighboring integrated circuit dies 100a, 100b according to the present disclosure. In FIG. 1B, components formed in various layers along the z-axis are superimposed on one another to show their relative positions in plan view. Positions of the components along the z-axis are shown in corresponding cross-sectional views, such as the views in FIGS. 1C and 1D. FIG. 1B illustrates relative positions of the circuit region 104, the seal region 106, and the edge interconnect features 108 within the integrated circuit dies 100 according to some embodiments. As shown in FIG. 1B, each integrated circuit die 100 is defined in a square area by the scribe lines 12. In some embodiments, the integrated circuit dies 100 may have a plan view area in a range between about 10 mm$^2$ and about 1000 mm$^2$, which may vary depending on the circuit design and/or function of the integrated circuit die 100. While FIG. 1B illustrates integrated circuit dies with a square shape in the plan view, it is contemplated that the integrated circuit dies may have other shapes in the plan view. For example, rectangular, hexagonal, octagonal shapes may be used to achieve design purposes. Depending on the design, the scribe lines 12 may have a width 12w in a range between about 1 μm to about 200 μm.

Within the die area of each integrated circuit die 100, the circuit region 104 is surrounded by the seal region 106 disposed at an outer perimeter of the circuit region 104. One or more sealing rings 110 (110a, 110b), 112 (112a, 112b) are concentrically formed in the seal region 106. The seal rings 110, 112 provide protection to circuit structures in the circuit region 104 against undesired elements from the exterior environment, such as moisture or water vapor, during and after separation of the integrated circuit dies 100. After being cut along the scribe lines 12, the portion of the scribe line 12 may remain on sides of the integrated circuit die 100, and the seal region 106 is surrounded by materials of the scribe lines 12 and not exposed on the cutting surfaces 102.

The edge interconnect features 108 are two or more conductive lines extending from the circuit region 104 through the seal region to intersect with the scribe lines 12. In some embodiments, the edge interconnect features 108 may intersect with the corresponding scribe line 12 at a substantially perpendicular manner. In other embodiments, the edge interconnect features 108 may intersect with the corresponding scribe line 12 at a slanted angle. For example, the edge interconnect features 108 may intersect the y-z plan at a slanted angle, such as an angle in a range between about 45 degree and about 90 degree. In some embodiments, the edge interconnect features 108 may be distributed along one or more of sides of the seal region 106. In some embodiments, the edge interconnect features 108 are a plurality of conductive lines evenly distributed along one or more sides 106 of the seal region 106.

In one embodiment shown in FIG. 1B, the edge interconnect features 108 are symmetrically arranged along all sides of the seal region 106a, 106b. The symmetrical distribution allow corresponding edge interconnect features 108 in neighboring integrated circuit dies 100 to form continuous conductive lines. Edge interconnect features 108a of the integrated circuit die 100a are in contact with corresponding edge interconnect features 108b of the integrated circuit die 100b to form a plurality of continuous conductive lines across the shared scribe line 12. Similarly, the edge interconnect features 108a along other sides of the seal region 106 may form continuous line features with corresponding edge interconnect features 108b in the neighboring integrated circuit die 100 along the other sides.

In some embodiments, the edge interconnect features 108a of the integrated circuit die 100a and the corresponding edge interconnect features 108b of the integrated circuit die 100b are fabricated as monolithic conductive lines. The monolithic conductive line arrangement may enable direct communication between devices in the neighboring integrated circuit dies, thereby allowing the neighboring integrated circuit dies to be packaged together without cutting from the scribe lines.

The continuous line features ensure that the edge interconnect features 108 are exposed on the cutting surfaces 102 for subsequent wiring and packaging process after the integrated circuit die 100 is cut free from the substrate 10. The symmetrical arrangement of the edge interconnect features 108 also provide design flexibilities. For example, a common scheme of edge interconnect feature arrangement may be used for different integrated circuit dies, such as for different SoCs, and different memory dies. It should be noted that the edge interconnect features 108 may be arranged in any suitable manner to achieve desired design proposes.

FIGS. 1C and 1D provide additional details of the edge interconnect features 108 within the integrated circuit die 100 according to embodiments of the present disclosure. FIG. 1C schematically illustrates details across the seal region 106 of the integrated circuit die 100. FIG. 1D schematically illustrates details of the integrated circuit die 100 along the sealing ring 110. FIG. 1E schematically illustrates details adjacent the scribe line 12 between the integrated circuit dies 100a, 100b.

As shown in FIGS. 1C and 1D, the device layer 120 is formed in and/or on the substrate 10, and the interconnect structure 122 are formed over the device layer 120. The device layer 120 may include various semiconductor devices, such as transistors, diodes, capacitors, resistors, etc. In some embodiments, the device layer 120 includes one or more dielectric layers overlying the semiconductor devices therein.

The interconnection structure 122 includes various conductive features, such as a first plurality of conductive features 126 and second plurality of conductive features 128, and one or more intermetal dielectric (IMD) layers 124 to separate and isolate various neighboring conductive features 126, 128. In some embodiments, the first plurality of conductive features 126 are conductive vias and the second plurality of conductive features 128 are conductive lines. The interconnection structure 122 includes multiple levels of the conductive features 128, and the conductive features 128 are arranged in each level to provide electrical paths to the devices in the device layer 120. The conductive features 126 provide vertical electrical routing from the device layer 120 to the conductive features 128, and between the conductive features 128 in different layers. The conductive features 126, 128 have increased dimensions in different levels along the z-axis.

The conductive features 126 and conductive features 128 may be made from one or more electrically conductive materials, such as one or more layers of graphene, metal, metal alloy, metal nitride, or silicide. For example, the conductive features 126 and the conductive features 128 may be made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layers 124 may be formed, for example, of a low dielectric constant (low-k) dielectric material, such as SiOx, SiOxCyHz, $SiO_xC_y$, SiCx, SiNx, or related low-k dielectric material, compounds thereof, composites thereof, combinations thereof, or the like. The IMD layers 124 may be formed by any suitable method, such as spinning, chemical vapor deposition (CVD), and/or plasma-enhanced CVD (PECVD). In some embodiments, the interconnect structure 122 may be formed sequentially layer-by-layer from the device layer 120 during BOEL processing. In some embodiments, the interconnect structure 122, the conductive features 126 and conductive features 128 may be fabricated using damascene and/or dual-damascene process.

As shown in FIG. 1C, a plurality of IMD layers 124 are sequentially formed over the device layer 120. The IMD layers 124 may be divided into three groups: bottom IMD layers 124x, middle IMD layers 124y, and top IMD layers 124z based on relative position to the device layer 120. The bottom IMD layers 124x, formed immediately on the device layer 120 are thinner and with the conductive features 126, 128 of a higher density. The middle IMD layers 124y formed over the bottom IMD layers 124x are thicker and with the conductive features 126, 128 of a lower density. The top IMD layers 124z formed over the middle IMD layers 124y are thickest and with the conductive features 126, 128 of a lowest density.

The sealing rings 110, 112 are formed in the seal region 106 between the circuit region 104 and the scribe line 12. Each of the sealing rings 110, 112 includes physically connected components to function as a barrier between the conductive features 126, 128 in the interconnect structure 122 and exterior environment, such as moisture. The sealing rings 110, 112 may be formed by any suitable materials, such as materials suitable as moisture barrier. In some embodiments, the sealing rings 110, 112 are formed with electrically conductive materials. In some embodiments, the sealing rings 110, 112 may be electrically grounded. In some embodiments, the sealing rings 110, 112 may be formed from the same material as the conductive features 126, 128. For example, the sealing rings 110, 112 may be formed from Cu, Al, Co, Ru, Mo, W, and related alloys.

FIGS. 1C and 1D schematically demonstrate one example of the sealing rings 110, 112. Other sealing ring structures may be used by persons skilled in the art with the integrated circuit die 100 according to present disclosure. As shown in FIGS. 1C and 1D, each of the sealing rings 110, 112 includes layers of substantially continuous sealing lines 110*l*, 112*l* connected by a plurality of sealing vias 110*v*, 112*v* formed in the IMD layers 124. The continuous sealing lines 110*l*, 112*l* in neighboring IMD layers 124 are connected by the plurality of sealing vias 110*v*, 112*v* respectively. The sealing lines 110*l*, 112*l* and sealing vias 110*v*, 112*v* may be fabricated layer-by-layer in the same process with the conductive features 126, 128 in the corresponding IMD layers 124.

The edge interconnect features 108 may be formed in one or more IMD layers 124. Each of the edge interconnect features 108 may be conductive line having an inner end 108*i* and an outer end 108*o*. The inner end 108*i* may be electrically connected to one or more conductive features 128, 126 in the circuit region 104. The outer end 108*o* is embedded in the scribe line 12 outside the seal region 106. In some embodiments, a portion of the edge interconnect features 108 may be dummy connectors to achieve structural uniformity in the integrated circuit die 100. For example, the inner end 108*i* of a portion of the edge interconnect features 108 may be "floating" in the IMD layer 124 without connecting to any other conductive features, such as conductive features 126, 128. If the integrated circuit die 100 is cut out along the scribe line 12, the outer ends 108*o* of the edge interconnect features 108 is exposed on the cutting surface 102.

The edge interconnect features 108 may extend through the sealing rings 110, 112 via openings 130 formed in the sealing ring 110, 112 and the corresponding IMD layer 124. Dielectric material of the IMD layer 124 is disposed between the edge interconnect features 108 and the sealing rings 110, 112 to electrically isolate the edge interconnect features 108 from the sealing rings 110, 112.

The edge interconnect features 108 may be formed in the same process with the conductive features 126, 128 in the corresponding IMD layers 124. In some embodiments, the sealing rings 110, 112 may be formed from the same material as the conductive features 126, 128. For example, the edge interconnect features 108 may be formed from Cu, Al, Co, Ni, Ru, Mo, W, Sn, Ag, and related alloys.

Alternatively, the edge interconnect features 108 may be formed by a selective bumping process. As shown in FIG. 1C, for example, the exposed cross-sectional surfaces 108*s* of the outer end 108*o* of the edge interconnect features 108 may be exposed and act as catalyst or a seed layer. Conductive features may selectively form on the exposed cross-sectional surfaces 108*s* by electroless plating, ALD, PEALD, CVD, or PECVD. In cases where ALD/CVD are performed, selective ALD/CVD may be achieved through surface reaction, surface state such as H-termination and surface free electron, and the sacrificial solid-state co-reactant. In some embodiments, selective deposition is enabled by catalytic behavior of a metal surface which promotes precursor reduction. As the deposition continues, the conductive features increase in dimension and join with the conductive features grown from the exposed cross-sectional surfaces 208*s* on the opposite side of the edge interconnect features 108, and forming the edge interconnect features 108.

Dimensions of the edge interconnect features 108 may be similar to the conductive features 128 in the same IMD layer 124. In some embodiments, the edge interconnect features 108 may have a line width 108*w* in a range between about 0.01 μm and about 6 μm, and a line depth 108*d* in a range between about 0.01 μm and about 6 μm. A width 130*w* of the openings 130 may be in a range between about 0.03 μm and about 18 μm.

Depending on the function and density of the edge interconnect features 108, the edge interconnect features 108 may be formed in the top IMD layers 124z as shown in FIGS. 1C, 1D and 1E, the bottom IMD layers 124x (FIGS. 1I and 1J), the middle IMD layers 124y (FIGS. 1F and 1G), and a top metal layer (not shown) above the top IMD layer 124z. Dimension of the edge interconnect features 108 may vary in different IMD layers 124.

In some embodiments, the scribe lines 12 between the integrated circuit dies 100 may also be filled with suitable materials. A dielectric material may be filled in the scribe lines 12 between the integrated circuit dies 100. The outer end 108o of the edge interconnect features 108 are surrounded by the dielectric material in the scribe lines 12, thus, are electrically isolated from one another. In some embodiments, the scribe lines 12 may be filled with the same material as in the IMD layers 124. The scribe lines 12 may be filled and then patterned layer-by-layer in the same process with the conductive features 126, 128 in the corresponding IMD layers 124. In some embodiments, the scribe lines 12 or the dielectric material filled in the scribe lines 12 may include one or more layers of a low dielectric constant (low-K) dielectric material, such as SiOx, SiOxCyHz, $SiO_xC_y$, SiCx, SiNx, or related low-k dielectric material, compounds thereof, composites thereof, combinations thereof, or the like.

FIG. 1E schematically illustrates that each of the edge interconnect features 108a of the integrated circuit die 100a and the corresponding edge interconnect features 108b of the integrated circuit die 100b form a continuous conductive line 1081 across the scribe line 12 between the inter circuit dies 100a, 100b. The scribe line 12 may include multiple layers of suitable materials formed on the substrate 10 between the seal regions 106a, 106b of the neighboring integrated circuit dies 102a, 102b. In some embodiments, the scribe line 12 may be formed layer-by-layer during the fabrication process of the device layer 120a, 120b and the interconnect structures 122a, 122b. Layers in the scribe line 12 may include the same materials of the dielectric layers 124 in the interconnect structures 122a, 122b. In some embodiments, the scribe line 12 may also include one or more dielectric layers between the device layers 120a, 120b. In other embodiments, the scribe line 12 may be formed separately from the interconnect structures 122a, 122b and/or the device layers 120a, 120b by suitable processes, such as patterning, deposition, and etching. Materials in the scribe line 12 may be different from the dielectric layers 124 in the interconnect structures 122a, 122b.

A plurality of conductive lines 1081 are formed across the scribe line 12 between the neighboring integrated circuit dies 100a, 100b. In some embodiments, a portion of the plurality of the conductive lines 1081 are functional connections with both ends connected to the conductive features 126/128 in the integrated circuit dies 100a, 100a. In some embodiments, a portion of the edge interconnect features 108 may be dummy connectors to achieve structural uniformity in the integrated circuit die 100. For example, the inner end 108i of a portion of the edge interconnect features 108 may be "floating" in the IMD layer 124 without connecting to any other conductive features, such as conductive features 126, 128. If the integrated circuit die 100 is cut out along the scribe line 12, the outer ends 108o of the edge interconnect features 108 is exposed on the cutting surface 102.

Figure 1F:
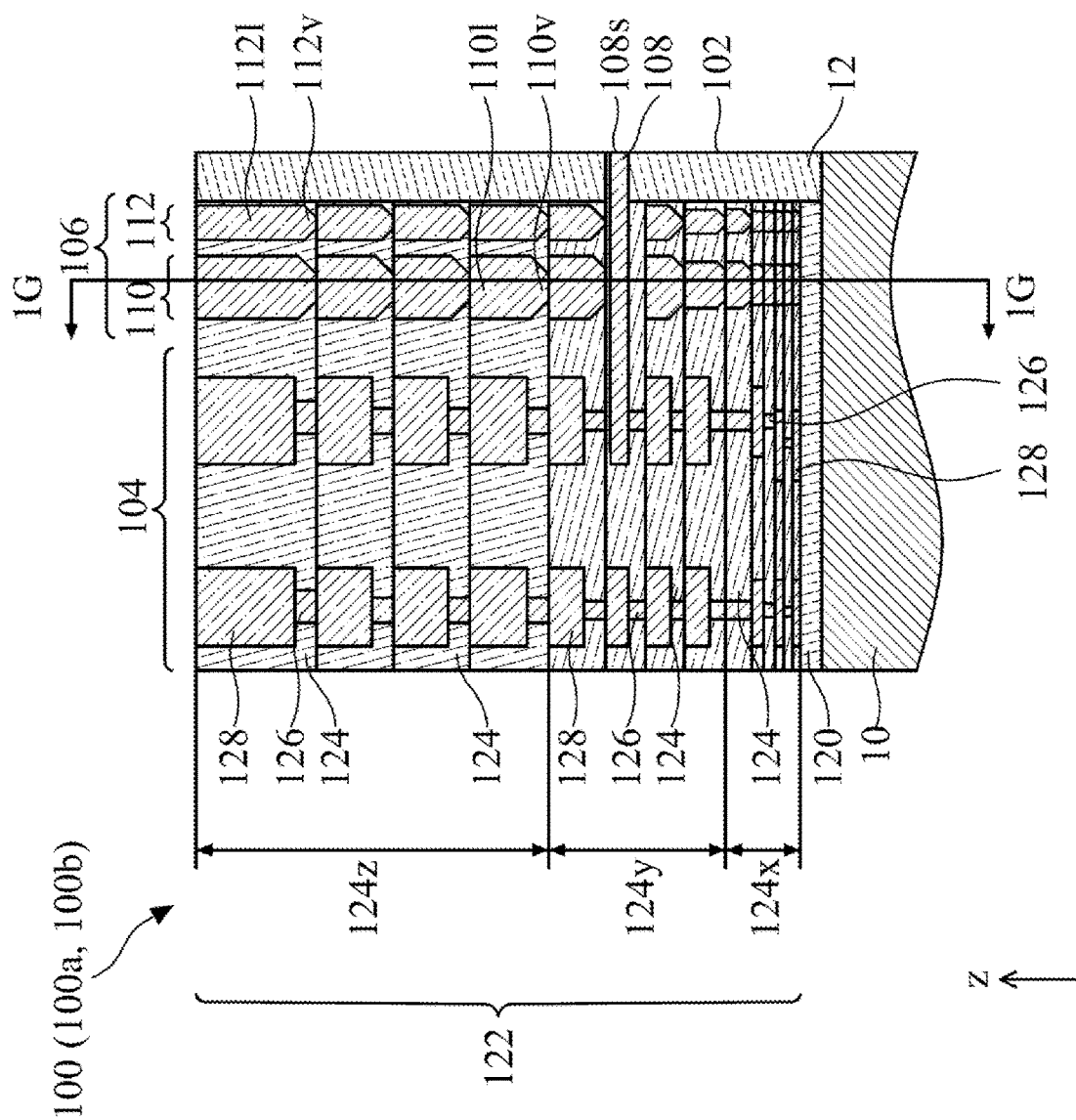
FIG. 1F is an enlarged partial sectional view of the integrated circuit die taken along the line 1C-1C in FIG. 1B, according to another embodiment.
Figure 1G:
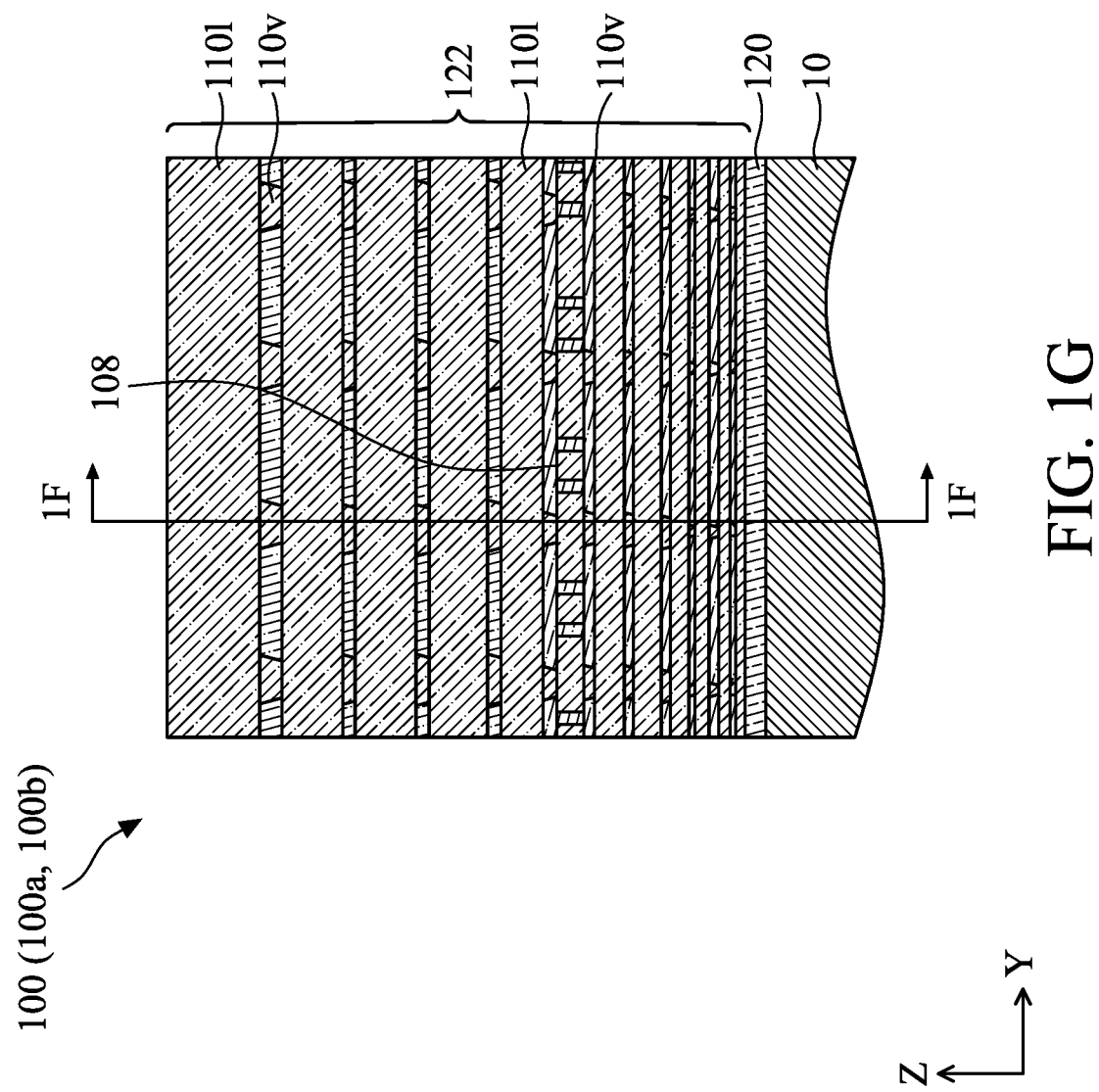
FIG. 1G is an enlarged partial sectional view of the integrated circuit die along the line 1G-1G in FIG. 1F.
Figure 1H:
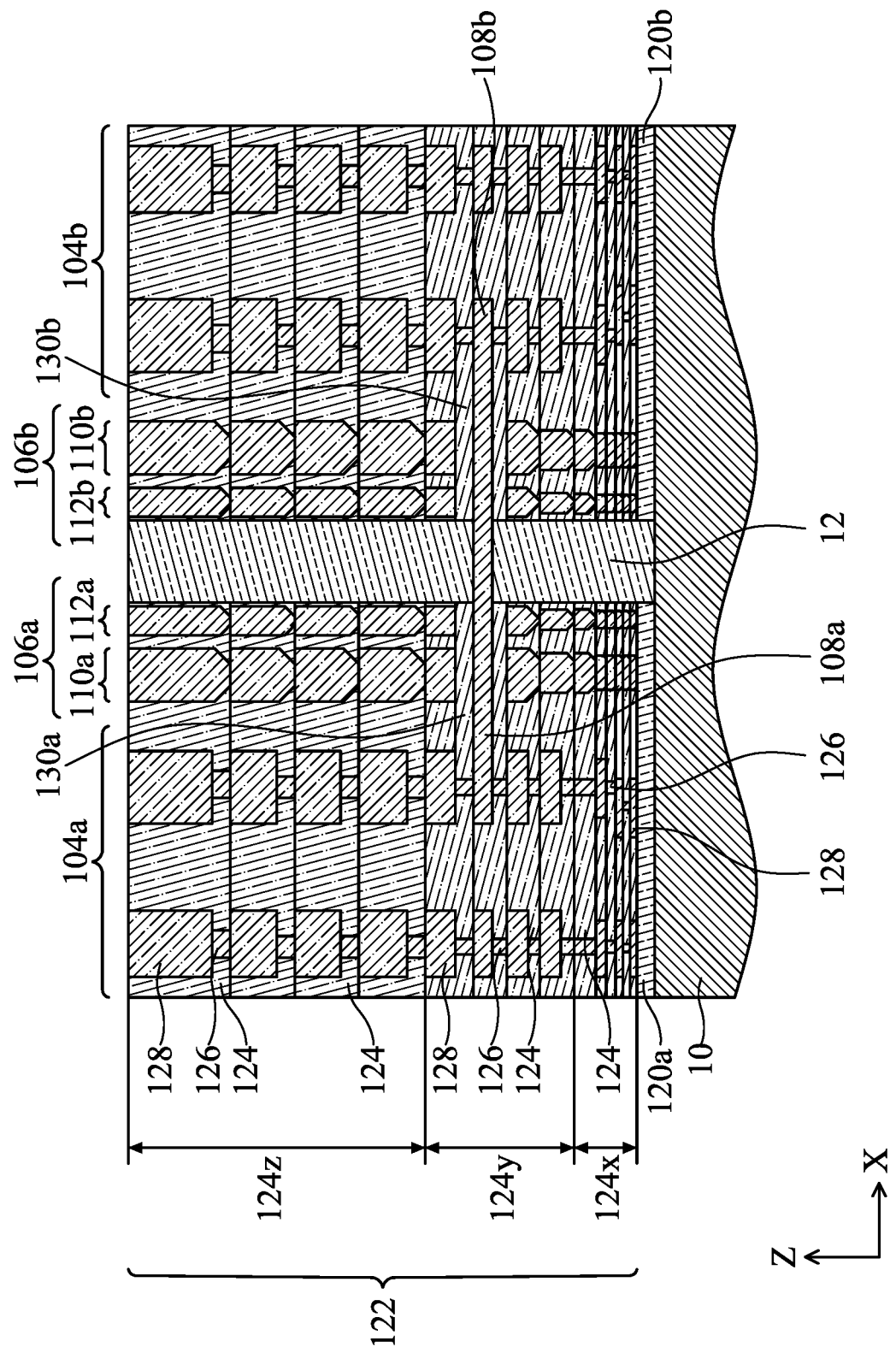
FIG. 1H is an enlarged partial sectional view of the neighboring integrated circuit die 100a, 100b along the line 1E-1E in FIG. 1B corresponding to the embodiment shown in FIGS. 1F and 1G.

FIG. 1F is an enlarged partial sectional view of the integrated circuit die 100 taken along the line 1C-1C in FIG. 1B, according to another embodiment. FIG. 1G is an enlarged partial sectional view of the integrated circuit die 100 along the line 1G-1G in FIG. 1F. FIG. 1H is an enlarged partial sectional view of the neighboring integrated circuit die 100a, 100b along the line 1E-1E in FIG. 1B corresponding to the embodiment shown in FIGS. 1F and 1G. In the embodiment shown in FIGS. 1F, 1G, and 1H, the edge interconnect features 108 are formed in the middle IMD layer 124y.

Figure 1I:
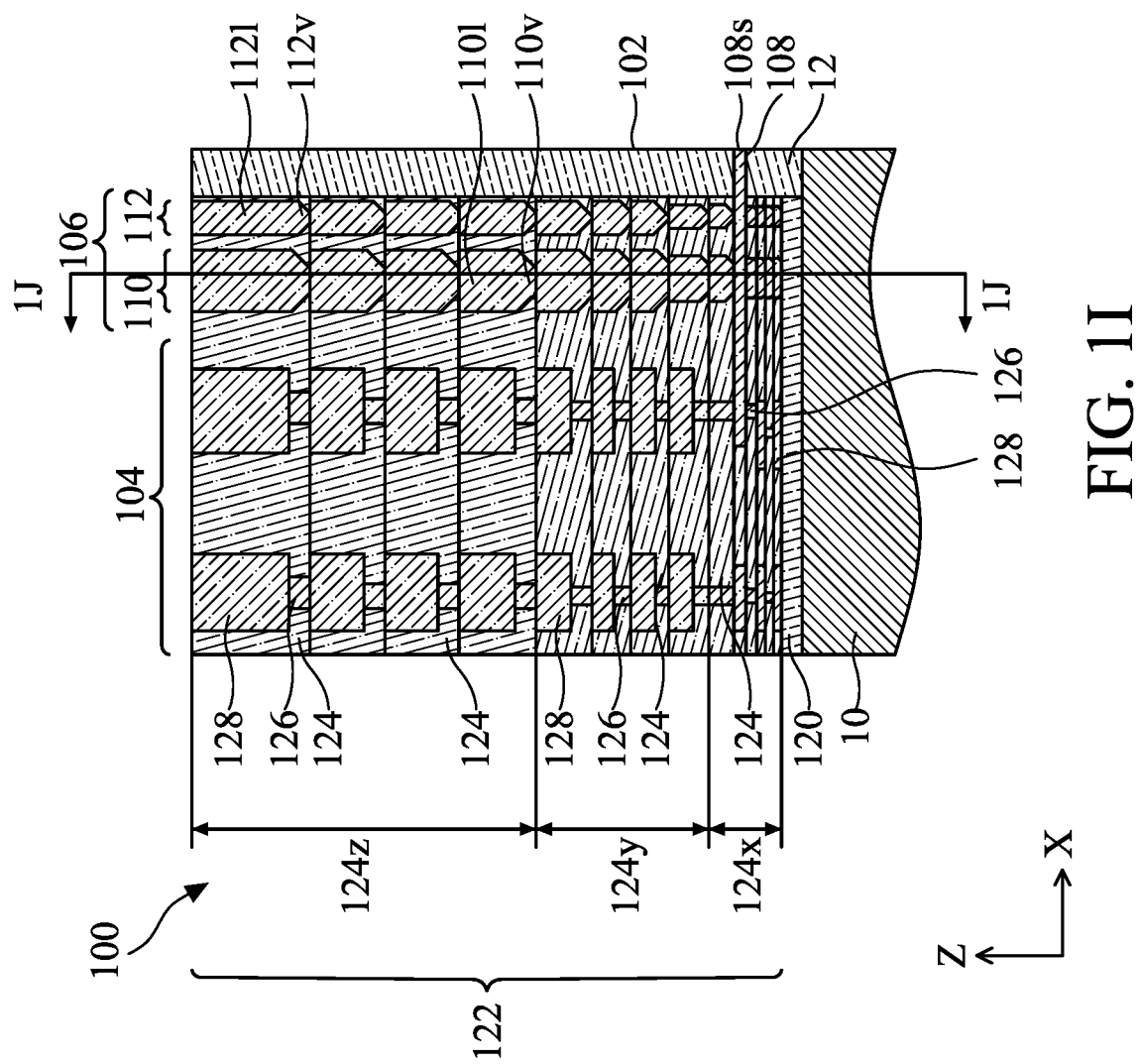
FIG. 1I is an enlarged partial sectional view of the integrated circuit die taken along the line 1C-1C in FIG. 1B, according to another embodiment.
Figure 1J:
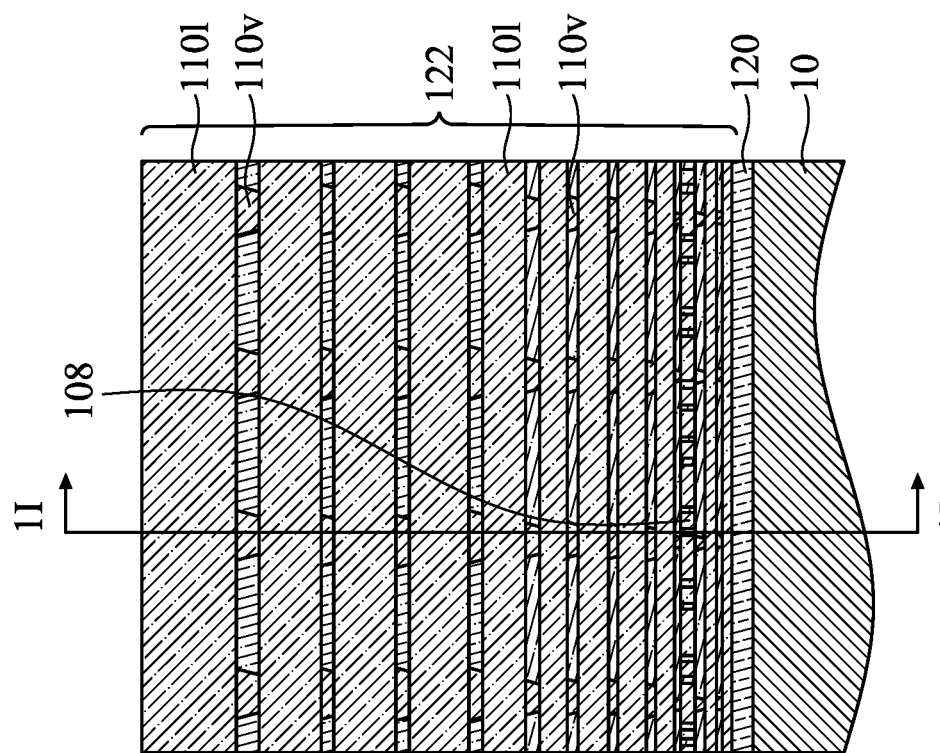
FIG. 1J is an enlarged partial sectional view of the integrated circuit die along the line 1J-1J in FIG. 1I.
Figure 1K:
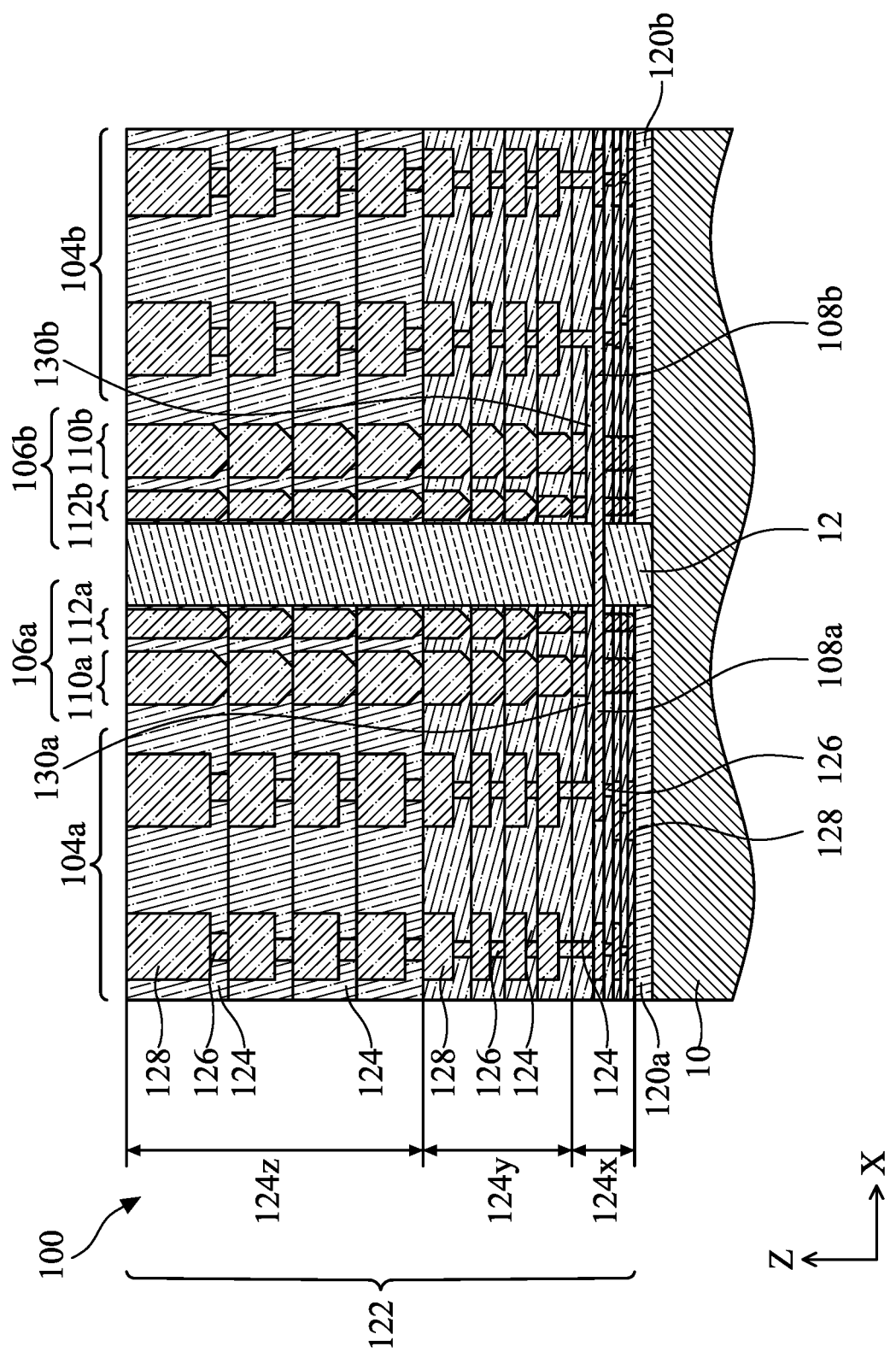
FIG. 1K is an enlarged partial sectional view of the neighboring integrated circuit die along the line 1E-1E in FIG. 1B corresponding to the embodiment shown in FIGS. 1I and 1J.

FIG. 1I is an enlarged partial sectional view of the integrated circuit die 100 taken along the line 1C-1C in FIG. 1B, according to another embodiment. FIG. 1J is an enlarged partial sectional view of the integrated circuit die 100 along the line 1J-1J in FIG. 1I. FIG. 1K is an enlarged partial sectional view of the neighboring integrated circuit die 100a, 100b along the line 1E-1E in FIG. 1B corresponding to the embodiment shown in FIGS. 1I and 1J. In the embodiment shown in FIGS. 1I, 1J, and 1K, the edge interconnect features 108 are formed in the bottom IMD layer 124x.

Figure 2:
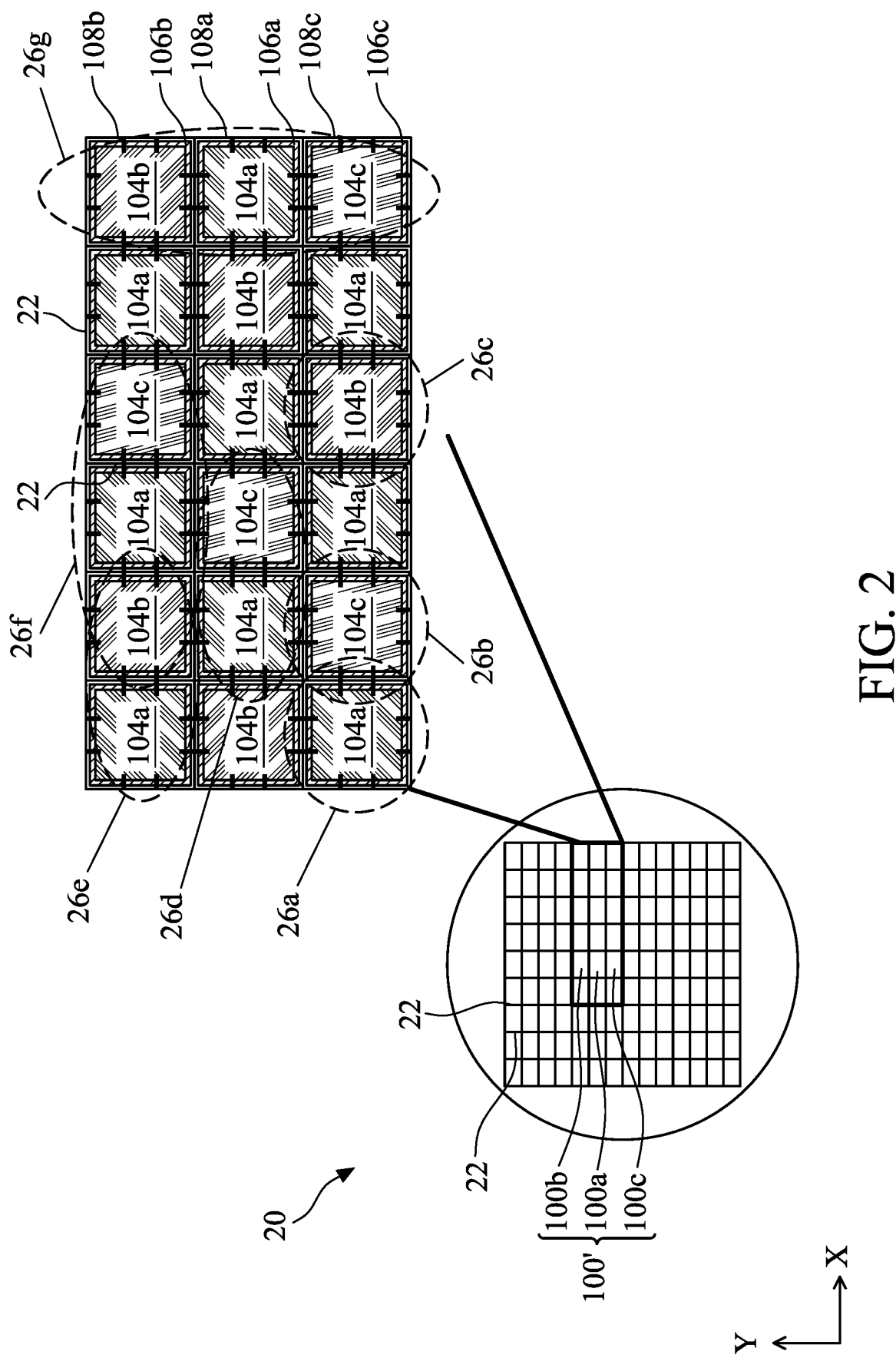
FIG. 2 is schematic plan views of a substrate having an array of integrated circuit dies formed thereon, in accordance with some embodiments.

FIG. 2 is schematic plan views of a substrate 20 having an array of integrated circuit dies 100' formed thereon, in accordance with some embodiments. The array of integrated circuit dies 100' are separated from each other by two sets of intersecting scribe lines 22. The plurality of integrated circuit dies 100 fabricated in and/or on the substrate 20 include three types of integrated circuit dies 100a, 100b, 100c. The integrated circuit dies 100a, 100b, 100c may have substantially the same dimension but with different circuit designs to achieve different functions. In some embodiments, the integrated circuit dies 100a, 100b, 100c may be different types of dies to be connected in various combinations. For example, the integrated circuit die 100a may be designed to connect with both the integrated circuit die 100b and integrated circuit die 100c. The integrated circuit dies 100a, 100b, 100c may be arranged in a pattern so that each of the integrated circuit die 100b is bordered by at least one integrated circuit die 100a, and each of the integrated circuit die 100c is bordered by at least one integrated circuit die 100a. Neighboring integrated circuit dies 100a, 100b are connected through the edge interconnect features 108a, 108b. Neighboring integrated circuit dies 100a, 100c are connected through the edge interconnect features 108a, 108c.

In some embodiments, the edge interconnect features 108 (108a, 108b, 108c) may be symmetrically arranged across all scribe lines 22 around the integrated circuit die 100 (100a, 100b, 100c) and share the same protocol so that the integrated circuit dies 100a, 100b, 100c can directly connect with one other through the edge interconnect features 108a, 108b, 108c.

Individual integrated circuit dies 100a, 100b, 100c may be tested before cutting. The integrated circuit dies 100a, 100b, 100c may be cut into various die combinations, such as die combinations 26a, 26b, 26c, 26d, 26e, 26f, 26g (represented by dotted lines) for packaging. For the die combinations 26a, 26b, 26c which include single integrated circuit dies 100a, 100b, 100c conductive features may be formed from the exposed edge interconnect features 108 to connect with other integrated circuit dies without going through an interposer. The die combinations 26d and 26e, which includes the two integrated circuit regions 104a/104c or 104a/104b, may be directly packaged as connected components. The die combinations 26f and 26g, which includes the three integrated circuit dies 100a, 100b, 100c in different arrangement, may be directly packaged as connected components.

Figure 3A:
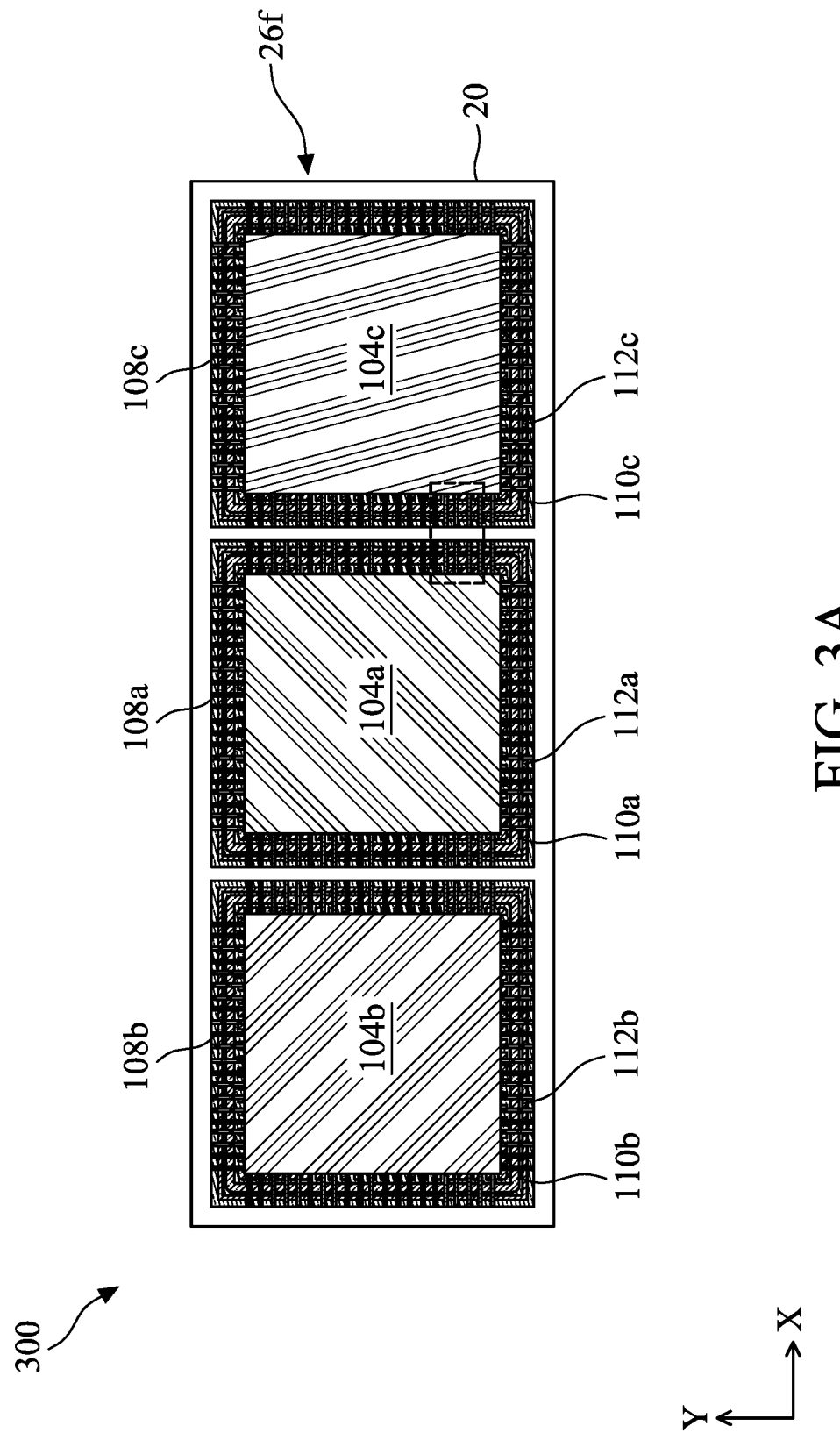
Figure 3B:
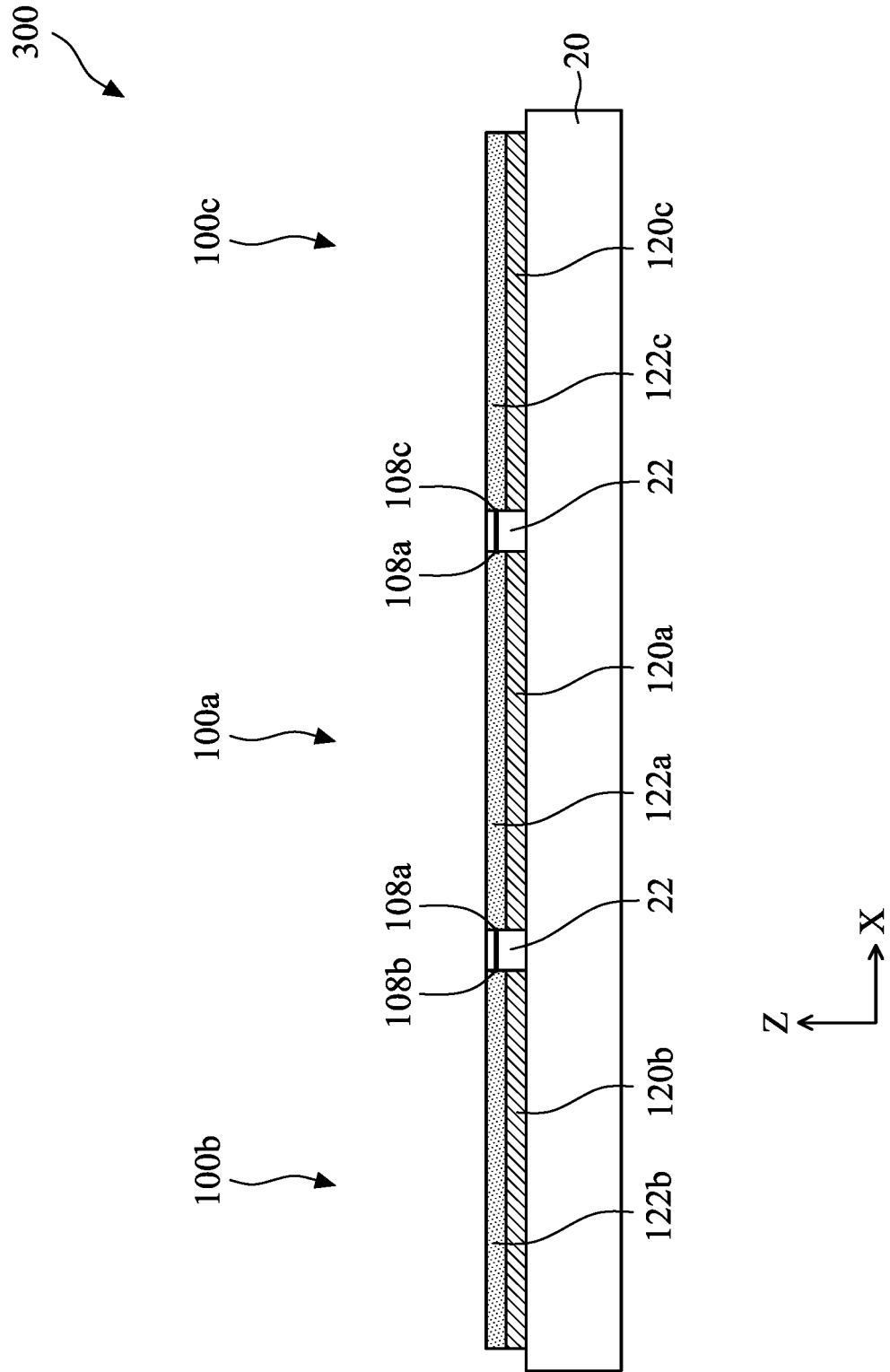

FIGS. 3A-3G schematically demonstrate various stages of forming a semiconductor package 300 according to embodiments of the present disclosure. The semiconductor package 300 includes a directly connected die combination with two or more integrated circuit dies using edge interconnect features and backside power rails. FIG. 3A is a schematic plan view of the semiconductor package 300. FIG. 3B is a schematic cross-sectional view of the semiconductor package 300. In FIG. 3A, the semiconductor package 300 includes the die combination 26f, which includes three integrated circuit dies 100b, 100a, 100c formed in and/or the substrate 20 and connected by the edge interconnect features 108a, 108b, 108c formed in the scribe line 22 (FIG. 3B).

As previously discussed in FIG. 2, the die combination 26f may be fabricated by fabricating the array of integrated circuit dies 100 including the integrated circuit dies 100b, 100a, 100c in a suitable pattern, testing individual integrated circuit dies 100a, 100b, 100c, and cutting out a die combination including good and connected integrated circuit dies 100b, 100a, 100c. The die combination 26f is only an example. Other die combinations, such as the die combination 26g may be used in place of the die combination 26g to fabricate semiconductor packages for other functions.

In some embodiments, the integrated circuit dies 100a, 100b, 100c may include any suitable circuit designs to achieve intended functions. For example, each of the integrated circuit dies 100a, 100b, 100c may be a system on a chip (SOC) or a system on integrated circuit (SOIC) die; a memory die, such as a static random-access memory (SRAM) die, a dynamic random-access memory (DRAM) die, a high bandwidth memory (HBM) die, or the like; a passive device die, such as a multilayer ceramic chip (MLCC) capacitor die, an integrated passive device (IPD) die, an integrated voltage regulator (IVR) die, the like, or a combination thereof; a logic die; an analog die; a microelectromechanical system (MEMS) die, a radio frequency (RF) die, or a combination thereof. In some embodiments, the integrated circuit dies 100a, 100b, 100c may be three different SOCs.

As shown in FIG. 3A, each of the integrated circuit die 100a, 100b, 100c includes the circuit region 104a, 104b, 104c surrounded by the one or more sealing rings 110a/112a, 110b/112b, 110c/112a. The edge interconnect features 108a, 108b, 108c extend from the corresponding circuit region 104a, 104b, 104c through the regions of the sealing rings 110a/112a, 110b/112b, 110c/112c into the scribe lines 22. In some embodiments, the scribe line 22 may be formed layer-by-layer during the fabrication process of the device layers 120a, 120b, 120c and the interconnect structures 122a, 122b, 122c. Layers in the scribe line 22 may include the same materials of the dielectric layers in the interconnect structures 122a, 122b, 122c. In FIG. 3B, the edge interconnect features 108a, 108b in the scribe line 22 between the integrated circuit dies 100a, 100b form continuous conductive lines to provide direct electric connections therebetween, and the edge interconnect features 108a, 108c in the scribe line 22 between the integrated circuit dies 100a, 100c form continuous conductive lines to provide direct electric connections therebetween.

Figure 3C:
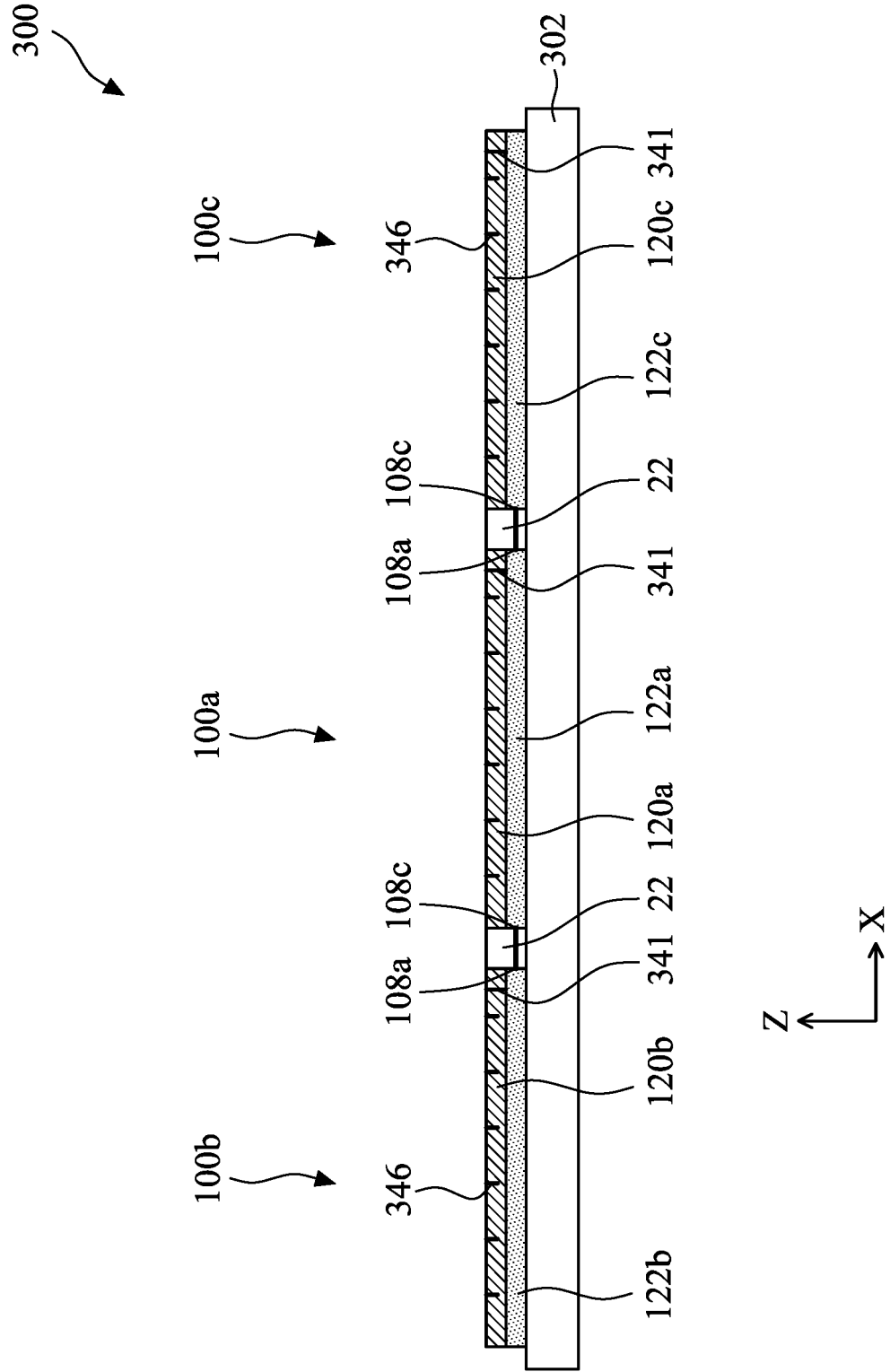
Figure 3D:
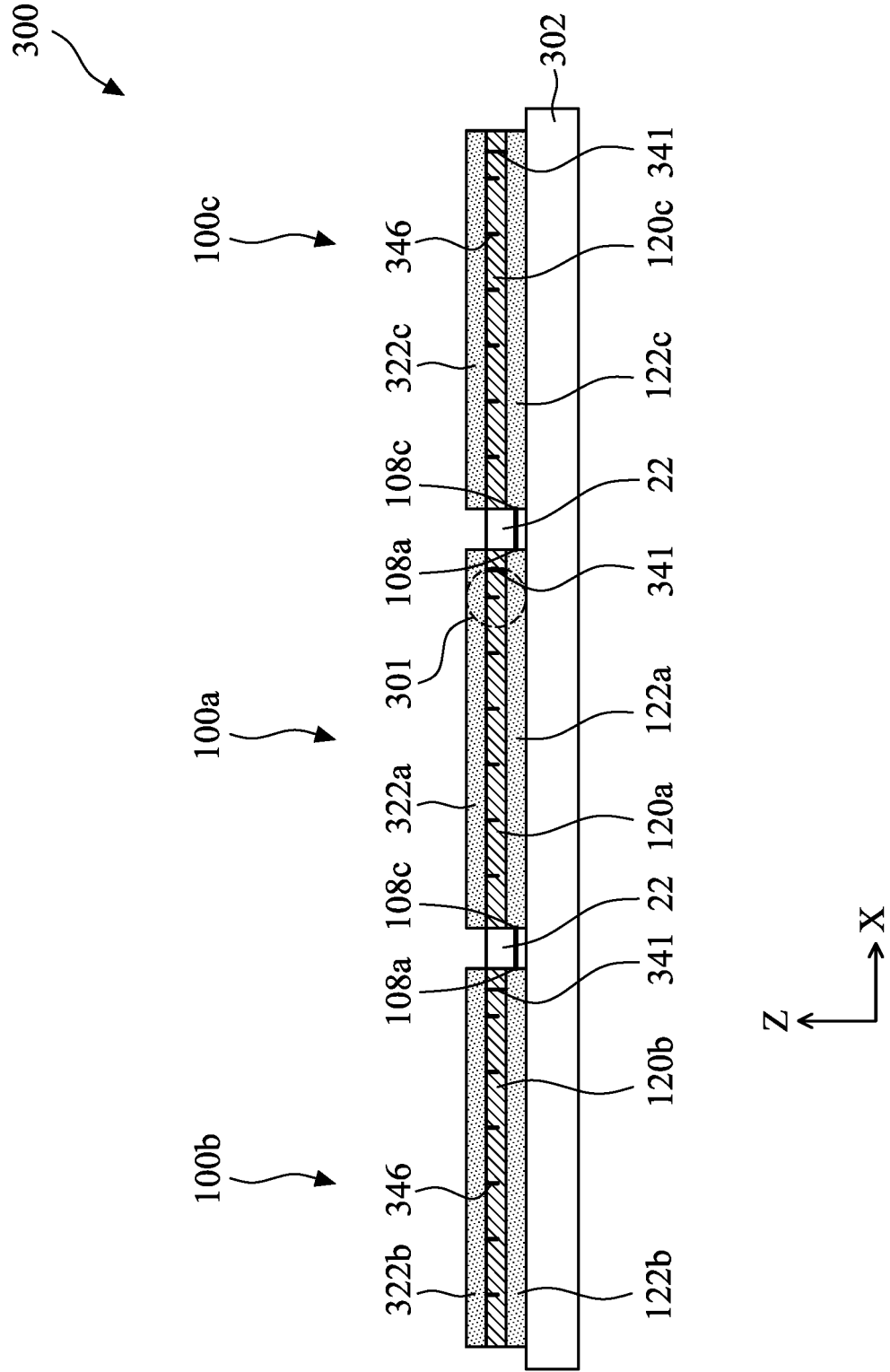

In FIG. 3C, after the formation of the edge interconnect features 108a, 108b, the die combination 26f is temporarily attached to a carrier substrate 302 by bonding the interconnect structures 122a, 122b, 122c to the carrier substrate 302. The carrier substrate 302 serves to provide mechanical support for integrated circuit die 100a, 100b, 100c so as to facilitate backside processing of the integrated circuit die 100a, 100b, 100c. The carrier substrate 302 is then flipped over so that the back side of the substrate 20 is facing up. Next, a thinning process is performed to remove portions of the substrate 20. One or more backside power rails (e.g., backside power rail 346 in FIG. 3D-1), which may be made of a conductive material, are formed on a back side of the device layers 120a, 120b, 120c. In some embodiments, either source or drain of epitaxial source/drain (S/D) features (e.g., epitaxial S/D feature 342 or 343 in FIG. 3D-1) is connected to the backside power rail. One or more power lines 341 are formed through the device layers 120a, 120b, 120c to provide direct connection between the interconnect structures 122a, 122b, 122c and the backside interconnect structures 322a, 322b, 322c (FIG. 3D). Details of the device layers 120a, 120b, 120c, the backside power rails 346, and the power lines 341 will be further discussed below with respect to FIG. 3D-1.

In FIG. 3D, backside interconnect structures 322a, 322b, 322c are formed on the back side of the device layers 120a, 120b, 120c. While not shown, the backside interconnect structures 322a, 322b, 322c may include one or more conductive features (e.g., conductive features 126 and conductive features 128) formed in a dielectric material (e.g., IMD layer 124), as discussed above with respect to FIGS. 1C-1K. Since the power lines 341 allow the power to be delivered from the front side to the back side of the device layers 120a, 120b, 120c (i.e., from interconnect structures 122a, 122b, 122c to backside interconnect structures 322a, 322b, 322c, or vice versa) and the backside interconnect structures 322a, 322b, 322c are in contact with the backside power rail 346, the integrated circuit die 100a, 100b, 100c can be powered directly from the back side of the device layers 120a, 120b, 120c through the backside power rails 346.

In some embodiments, which can be combined with any one or more embodiments of this disclosure, the edge interconnect features 108a, 108b, 108c can be provided at the backside interconnect structures 322a, 322b, 322c to connect neighboring integrated circuit die 100a, 100b, 100c. Alternatively, the integrated circuit die 100a, 100b, 100c can be connected through the edge interconnect features 108a, 108b, 108c provided at both interconnect structures 122a, 122b, 122c and the backside interconnect structures 322a, 322b, 322c.

FIG. 3D-1 illustrates an enlarged view of a portion 301 of the device layer 120a shown in FIG. 3D according to embodiments of the present disclosure. FIGS. 3D-2 and 3D-3 further show an enlarged view of a portion of the interconnect structures 122a and the backside interconnect structures 322a, respectively, in accordance with some embodiments. It is contemplated that arrangements of the devices and/or layers shown in the portion 301 are applicable to the device layers 120b, 120c. In FIG. 3D-1, the device layer 120a generally includes a nanostructure transistor. The term "nanostructure" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure transistors may be referred to as nanowire/nanosheet transistors, gate-all-around (GAA) transistors, multi-bridge channel (MBC) transistors, or any transistors having a gate electrode layer surrounding channel regions. While embodiments shown in FIG. 3D-1 are discussed with respect to nanostructure transistors, other devices, such as Fin-FETs, Horizontal Gate All Around (HGAA) FETs, Vertical Gate All Around (VGAA) FETs, and other suitable devices, may be adapted. A person having ordinary skill in the art will readily understand other modifications that may be made are contemplated within the scope of this disclosure.

In some embodiments, the device layer 120a includes gate structures 340 and epitaxial source/drain (S/D) features 342, 343, 344 disposed on opposite sides of the gate structure 340. A first and second stacks of semiconductor layers 350, 352, which define channel regions for the nanostructure transistor, are disposed between and in contact with the epitaxial S/D features 342, 343, 344, respectively. The gate structures 340 each includes gate spacers 358 formed on sidewalls of the gate structures 340, an interfacial layer (IL) 360 formed around surfaces of each semiconductor layer of the stack of semiconductor layers 350, 352, a high-k (HK) dielectric layer 362 formed around each semiconductor layer of the stack of semiconductor layers 350, 352, and a gate electrode layer 364 formed on the HK dielectric layer 362 surrounding each semiconductor layer of the stack of semiconductor layers 350, 352. An inner spacer 366 is formed between the gate electrode layer 364 and the epitaxial S/D features 342, 343, 344.

In one embodiment shown in FIG. 3D-1, a S/D contact 348 is disposed on a first side (e.g., front side) of the device layer 120a. The S/D contact 348 is separated from the epitaxial S/D feature 342 by a silicide layer 349. The silicide layer 349 may be made of a metal or metal alloy. An interlayer dielectric (ILD) layer 368 is disposed on the first side of device layer 120a and separated from the epitaxial S/D features 343, 344 by a contact etch stop layer (CESL) 370. Surfaces of portions of the S/D contact 348, the gate spacers 358, the HK dielectric layer 362, the gate electrode layer 364, the ILD layer 368, and the CESL 370 are substantially co-planar and in contact with the interconnect structure 122a.

The interconnect structure 122a may include a plurality of conductive lines 328 and conductive vias 326 formed in a dielectric material 324, as shown in FIG. 3D-2. The conductive lines 328, the conductive vias 326, and the dielectric material 324 may be configured in a similar fashion as the conductive lines 128, the conductive vias 126, and the IMD layer 124 discussed above with respect to FIGS. 1C-1K.

The backside power rail 346 is formed on a second side (e.g., back side) of the device layer 120a opposing the first side. The backside power rail 346 may be formed after the interconnect structure 122a has been formed on the first side. In some embodiments, after the die combination 26f is temporarily attached to the carrier substrate 302 and the carrier substrate 302 is flipped over, a thinning process is performed to remove portions of the substrate 20. The thinning process may be any suitable process, such as CMP, mechanical grinding, wet etching, dry etching, or combinations thereof. Next, a hard mask (not shown) may be formed on a portion of the substrate 20 over the epitaxial S/D features (e.g., epitaxial S/D feature 343) to be connected to the backside power rail. The portion of the substrate 20 not covered by the hard mask is then removed to form an opening exposing epitaxial source/drain (S/D) features (e.g., epitaxial S/D features 342, 344), which may be an epitaxial drain feature. A liner 347 is formed on the exposed epitaxial drain feature. The liner 347 may be formed of nitrides or metal nitrides, such as TaN, TiN, WN, MoN, or the like. The liner 347 may also be made of a dielectric material (e.g., SiN). A dielectric material 372, which may be any suitable dielectric material, such as an oxide, is then formed on the liner 347 and fills the opening. The remaining portion of the substrate 20 that was not covered by the hard mask is then removed to form an opening exposing epitaxial S/D features (e.g., epitaxial S/D feature 343) that was previously protected by the hard mask, resulting in a plurality of epitaxial source features (e.g., epitaxial S/D feature 343) exposed through the openings, while a plurality of epitaxial drain features (e.g., epitaxial S/D feature 342, 344) disposed below the dielectric material 372.

A third silicide layer 345, which may be made of a metal or metal alloy, is selectively formed on the exposed epitaxial source features (e.g., epitaxial S/D feature 343). A conductive feature, which may be made of any suitable metal such as Cu, Al, Co, Ru, Mo, Ir, W, or related alloys, is then formed in the opening on the silicide layer 345, forming the backside power rail 346 for the device layer 120a. In some embodiments, the backside power rail 346 is made of two-dimensional (2D) materials. The term "2D materials" used in this disclosure refers to single layer materials or monolayer-type materials that are atomically thin crystalline solids having intralayer covalent bonding and interlayer van der Waals bonding. Examples of a 2D material may include graphene, doped graphene, or transition metal dichalcogenides (MX2), where M is a transition metal element and X is a chalcogenide element. Some exemplary MX2 materials may include, but are not limited to, Hf, $Te_2$, $WS_2$, $MoS_2$, $MoSe_2$, WSe2, $MoTe_2$, $MoSe_2$, or any combination thereof. In some embodiments, the backside power rail 346 may have a dimension in a range of about 0.01 µm and about 6 µm.

After the backside power rail 346 is formed, a planarization process (e.g., CMP) is performed on the back side of the device layer 120a so that exposed surfaces of the backside power rail 346, the liner 347, the dielectric material 372, and the power line 341 are substantially co-planar. While not shown, the power line 341 may include a plurality of conductive lines and vias (e.g., conductive lines and vias 128, 126) extending from the interconnect structure 122a through the dielectric material 372 to the backside interconnect structure 322a. The power line 341 may be formed layer-by-layer during the fabrication process of the device layers 120a, 120b, 120c and the backside power rails 346. In some embodiments, the one or more power lines 341 are provided at the edge region of the device layers 120a, 120b, 120c, for example, at the edge of the circuit region 104a, 104b shown in FIG. 1B.

After CMP, the backside interconnect structure 322a is formed on the back side of the device layer 120a. The backside interconnect structure 322a is in contact with the backside power rail 346, the liner 347, the dielectric material 372, and the power line 341. As shown in FIG. 3D-3, the backside interconnect structure 322a includes a plurality of conductive lines 328' and conductive vias 326' formed in a dielectric material 324. Likewise, the conductive lines 328', the conductive vias 326', and the dielectric material 324' may be configured in a similar fashion as the conductive lines 128, the conductive vias 126, and the IMD layer 124 discussed above with respect to FIGS. 1C-1K.

Since the epitaxial source features (e.g., epitaxial S/D feature 343) are connected to the backside power rail 346 disposed on the back side of the device layer 120a, and epitaxial drain features is connected to a power rail (not shown) disposed on the front side of the device layer 120a, the epitaxial source features can be powered directly by a positive voltage (VDD) or a negative voltage (VSS) (i.e., ground or zero voltage) provided through the power line 341, the backside interconnect structures 322a, and to the backside power rail 346, while the epitaxial drain features (e.g., epitaxial S/D feature 342) are powered from the front side. The use of the backside power rail 346 saves an amount of routing resources used on the front side of device layer 120a, and reduces BEOL process complexity without abnormal electrical mis-connection issues. In addition, power consumption of the integrated circuit die 100a and the integrated circuit die 376 (e.g., memory die) to be bonded to the back side of the device layer 120a can be lowered since the power can be provided through both the backside power rail 346 and the power lines 341. While not shown, it is contemplated that various embodiments of FIGS. 3D-1 to 3D-3 are applicable to the integrated circuit dies 100b, 100c.

In FIG. 3E, after backside interconnect structures 322a, 322b, 322c are formed on the back side of the device layers 120a, 120b, 120c, an integrated circuit die 376 is provided over the back side of the integrated circuit dies 100a, 100b, 100c. The integrated circuit die 376 may be designed to perform any suitable function. In some embodiments, the integrated circuit die 376 is a memory die, such as a static random-access memory (SRAM) die, a dynamic random-access memory (DRAM) die, a high bandwidth memory (HBM) die, or the like. The integrated circuit die 376 may be formed in and/or on a substrate (not shown). An interconnect structure 374 is then formed on the integrated circuit die 376. FIG. 3E-1 shows an enlarged view of a portion 303 of the interconnect structure 374 in accordance with some embodiments. In some embodiments, the interconnect structure 374 includes a plurality of conductive lines 328" and conductive vias 326" formed in a dielectric material 324". The conductive lines 328", the conductive vias 326", and the dielectric material 324" may be configured in a similar fashion as the conductive lines 128, the conductive vias 126, and the IMD layer 124 discussed above with respect to FIGS. 1C-1K.

Next, the integrated circuit die 376 is temporarily attached to a carrier substrate 304. The carrier substrate 304 is then flipped over so that the interconnect structure 374 is facing down. The interconnect structure 374 is bonded to the backside interconnect structures 322a, 322b, 322c through a hybrid bonding technique. In some embodiments, the conductive lines of the backside interconnect structures 322a, 322b, 322c may be directly bonded to the conductive lines of the interconnect structure 374 using fusion bonding and annealing processes. For example, the conductive line 328' of the backside interconnect structure 322a is directly bonded to the conductive line 328" of the interconnect structure 374. In some embodiments, the integrated circuit die 376 is bonded to the integrated circuit dies 100a, 100b, 100c so that a gap 377 is defined between the interconnect structure 374, the scribe line 22, and the backside interconnect structures 322a, 322b (and the backside interconnect structures 322a, 322c).

Figure 3F:
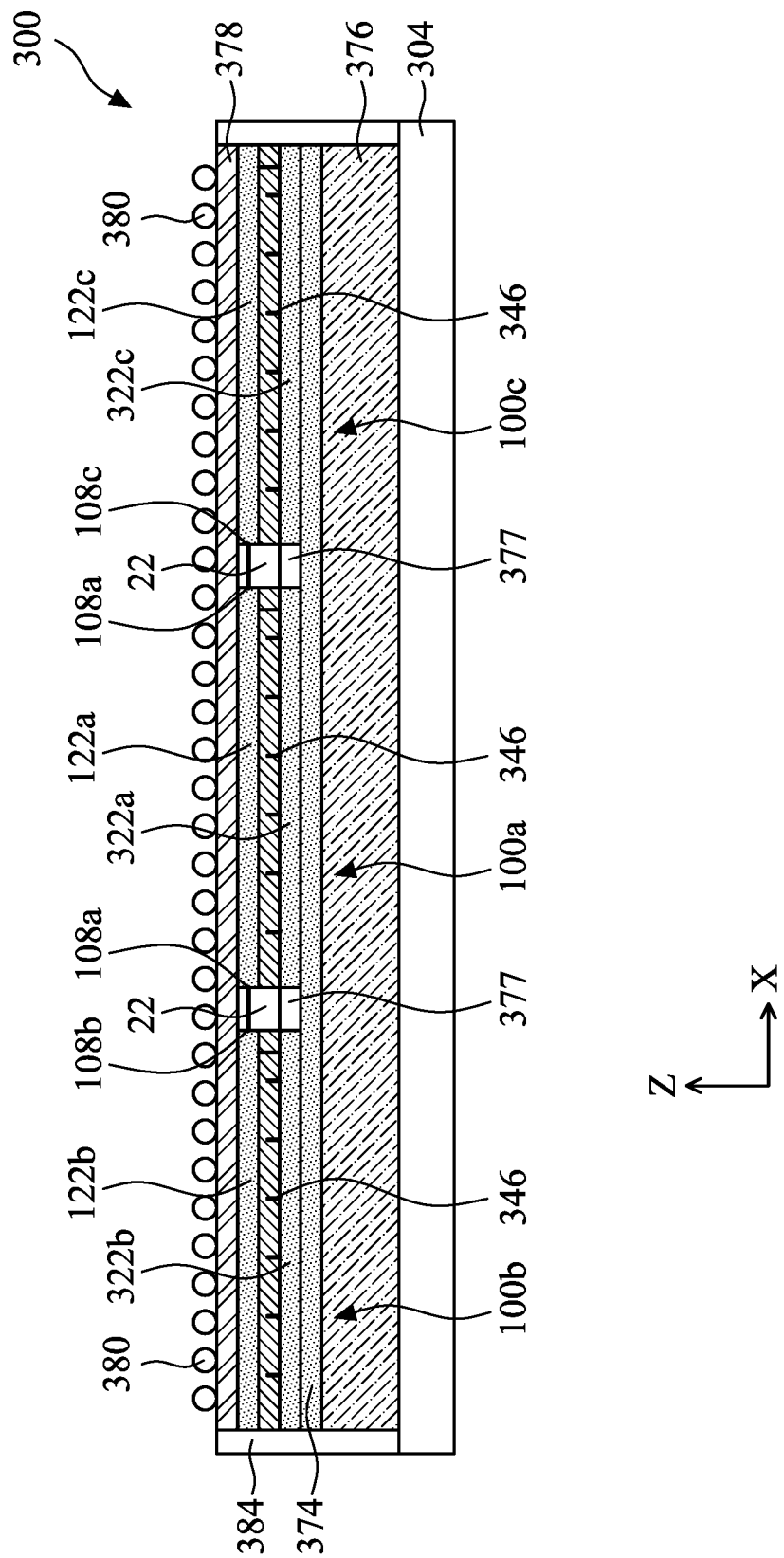

In FIG. 3F, after the integrated circuit die 376 and the integrated circuit dies 100a, 100b, 100c are bonded together, the carrier substrate 302 is removed, and the carrier substrate 304 is flipped over so that the interconnect structures 122a, 122b, 122c are facing up. A redistribution layer (RDL) 378, which may include one or more contact pads (not shown) formed in one or more passivation layers (not shown), is provided on the interconnect structures 122a, 122b, 122c. The RDL 378 rearranges the bonding pads from the edge to the center of each integrated circuit die 100a, 100b, 100c for flip chip bonding or other suitable packaging technology, thereby integrating the integrated circuit dies 100a, 100b, 100c to a board (e.g., a printed circuit board 382 in FIG. 3G). Upon formation of the RDL 378, external contacts 380 are formed on the RDL 378. The external contacts 380 may be solder bumps, copper bumps, or other suitable external contacts that may be made to provide electrical connection from the integrated circuit dies 100a, 100b, 100c to the integrated circuit die 376.

In some embodiments, after formation of the RDL 378, an encapsulant layer 384 may be formed on the substrate 20. The encapsulant layer 384 may be a molding compound, epoxy, or the like. The encapsulant layer 384 may be formed over the substrate 20 such that the RDL 378, the integrated circuit dies 100a, 100b, 100c, the integrated circuit die 376, the interconnect structures 122a, 122b, 122c, the backside interconnect structures 322a, 322b, 322c, and the interconnect structure 374 are buried or covered in the encapsulant layer 384. The encapsulant layer 384 may then be cured and undergo a grinding process until contact pads on the RDL 378 are exposed. Thereafter, the external contacts 380 are formed on the RDL 378 so that the exposed contact pads on the RDL 378 are in contact with the external contacts 380.

Figure 3G:
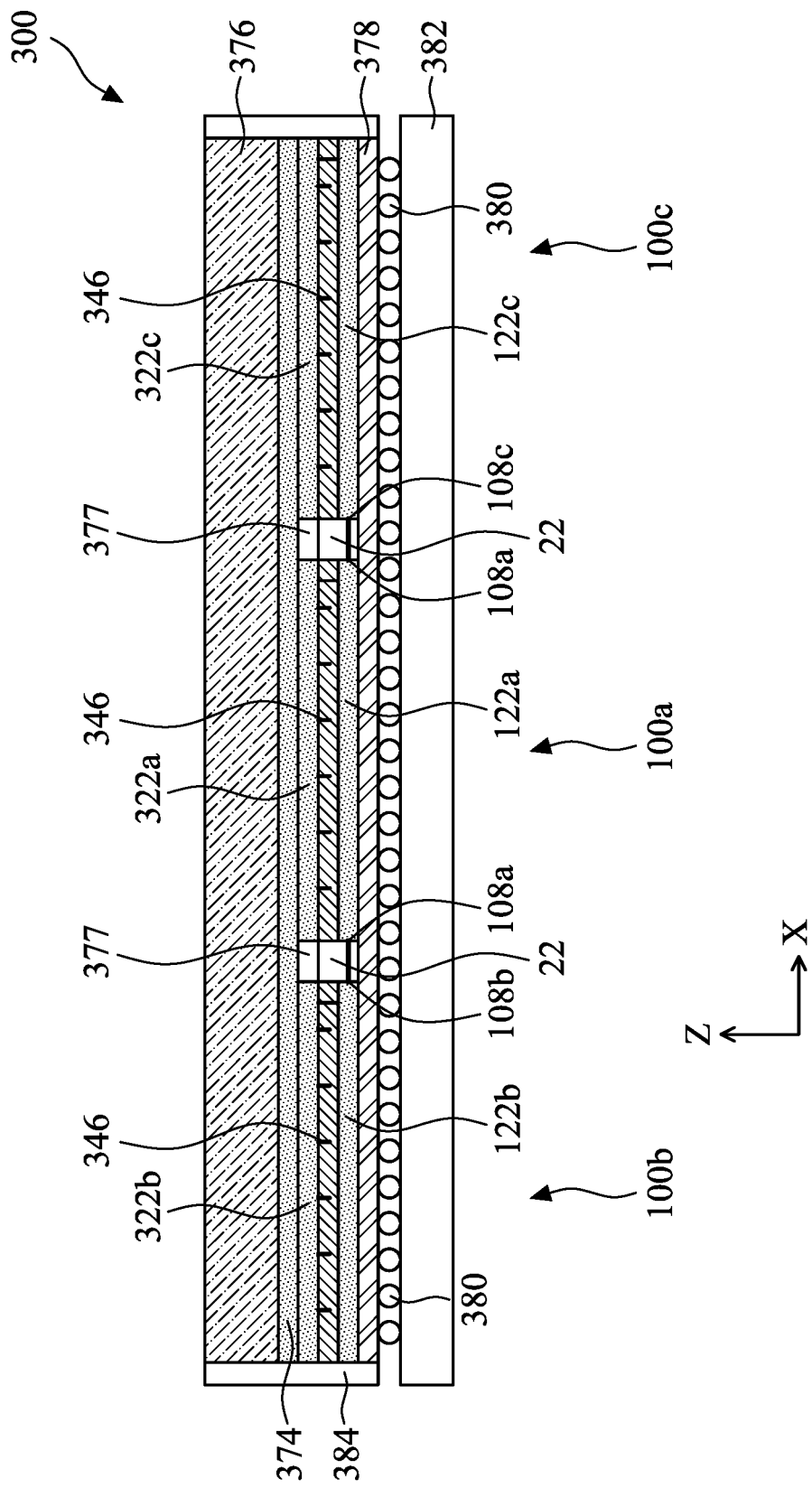

In FIG. 3G, after the external contacts 380 are formed on the RDL 378, the carrier substrate 304 is flipped over and the external contacts 380 are connected to a printed wiring board or printed circuit board (PCB) 382. The carrier substrate 304 is then removed. The PCB 382 may be part of an electronic system, such as computers, wireless communication devices, computer-related peripherals, entertainment devices, or the like. The external contacts 380 provide external connections from the PCB 382 (through the RDL 378, the interconnect structures 122a, 122b, 122c) to the integrated circuit dies 100a, 100b, 100c, while the edge interconnect features 108a, 108b, 108c provide internal, direct connection between or among the integrated circuit dies 100a, 100b, 100c. The direct connection between different integrated circuit dies reduces interposer layers, redistribution process, and bumping processes in multi-die integration, thus, reducing cost of manufacturing. The edge interconnect features 108a, 108b, 108c enable signal/power to be directly transferred therethrough, instead of going through interposer substrates, or PCBs, thus achieve higher performance. The edge interconnect features 108a, 108b, 108c also enable higher routing density than through an interposer. The power lines 341 provide direct power connection between the interconnect structure 374 and the backside interconnect structures 322a, 322b, 322c, and the integrated circuit die 376 and devices in the integrated circuit dies 100a, 100b, 100c can be directly powered through the use of the backside power rails 346 and the power lines 341. The semiconductor package 300 may be suitable for those require low power or mobile applications.

While three integrated circuit dies 100a, 100b, 100c are shown in the semiconductor package 300, less or more integrated circuit dies with edge interconnect features may be packaged together according to circuit design. In addition, while the integrated circuit dies 100a, 100b, 100c in the semiconductor package 300 have substantially the same shape and the dimension, integrated circuit dies of different dimension and/or shape may be included in the semiconductor packages so along as edge interconnect features in different integrated circuit dies to be connected are aligned for connection.

Figure 4:
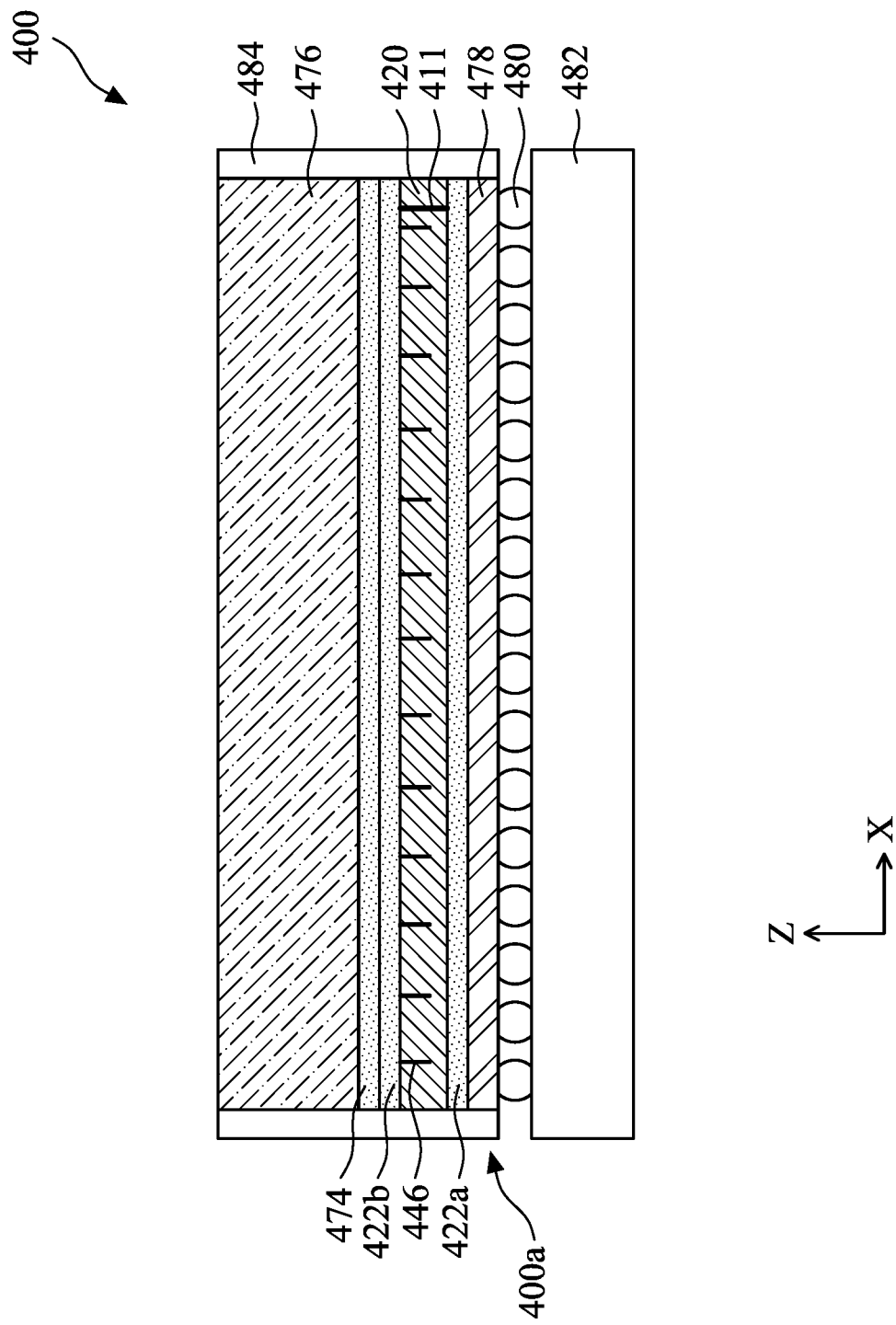
FIG. 4 schematically demonstrates a semiconductor package in accordance with some embodiments.

FIG. 4 schematically demonstrates a semiconductor package 400 in accordance with some embodiments. The semiconductor package 400 is similar to the semiconductor package 300 except that an integrated circuit die is stacked over and connected to one integrated circuit die without going through an interposer or edge interconnect features. As shown in FIG. 4, the semiconductor package 400 includes a first integrated circuit die 476 disposed over a second integrated circuit die 400a. The first integrated circuit die 476 may be a memory die, such as the integrated circuit die 376. The second integrated circuit die 400a may be a SOC, such as the integrated circuit dies 100a, 100b, 100c. The first integrated circuit die 476 has an interconnect structure 474, such as the interconnect structure 374. The second integrated circuit die 400a has an interconnect structure 422a, such as the interconnect structure 122a, disposed on a first side (e.g., front side) of a device layer 420. The second integrated circuit die 400a also has a backside interconnect structure 422b, such as the backside interconnect structure 322a, disposed on a second side (e.g., back side) of the device layer 420 opposing the first side. The backside interconnect structure 422b of the second integrated circuit die 400a is directly bonded to the interconnect structure 474 of the first integrated circuit die 476.

The semiconductor package 400 includes one or more backside power rails 446, such as backside power rails 346, formed on the second side of the device layer 420. The semiconductor package 400 further includes one or more power lines 441 extending through the device layer 420 to provide direct connection between the interconnect structure 422a and the interconnect structure 474. The RDL 478 is in contact with the interconnect structure 422a of the second circuit die 400a. An encapsulant layer 484, such as the encapsulant layer 384, covers the first integrated circuit die 476, the second integrated circuit die 400a, the RDL 478, and the interconnect structures 422a, the backside interconnect structure 422b, and the interconnect structure 474. External contacts 480, such as the external contacts 380, are formed on the RDL 478 to provide external connection from a PCB 482 to the integrated circuit die 400a. The power lines 441, the interconnect structure 474, and the backside interconnect structures 422b provide direct connection between the integrated circuit die 476 and the integrated circuit die 400a, and the integrated circuit die 476 and devices in the integrated circuit die 400a can be directly powered through the backside power rails 446 and power lines 441. The semiconductor package 400 may be suitable for those require low power or mobile applications.

Figure 5:
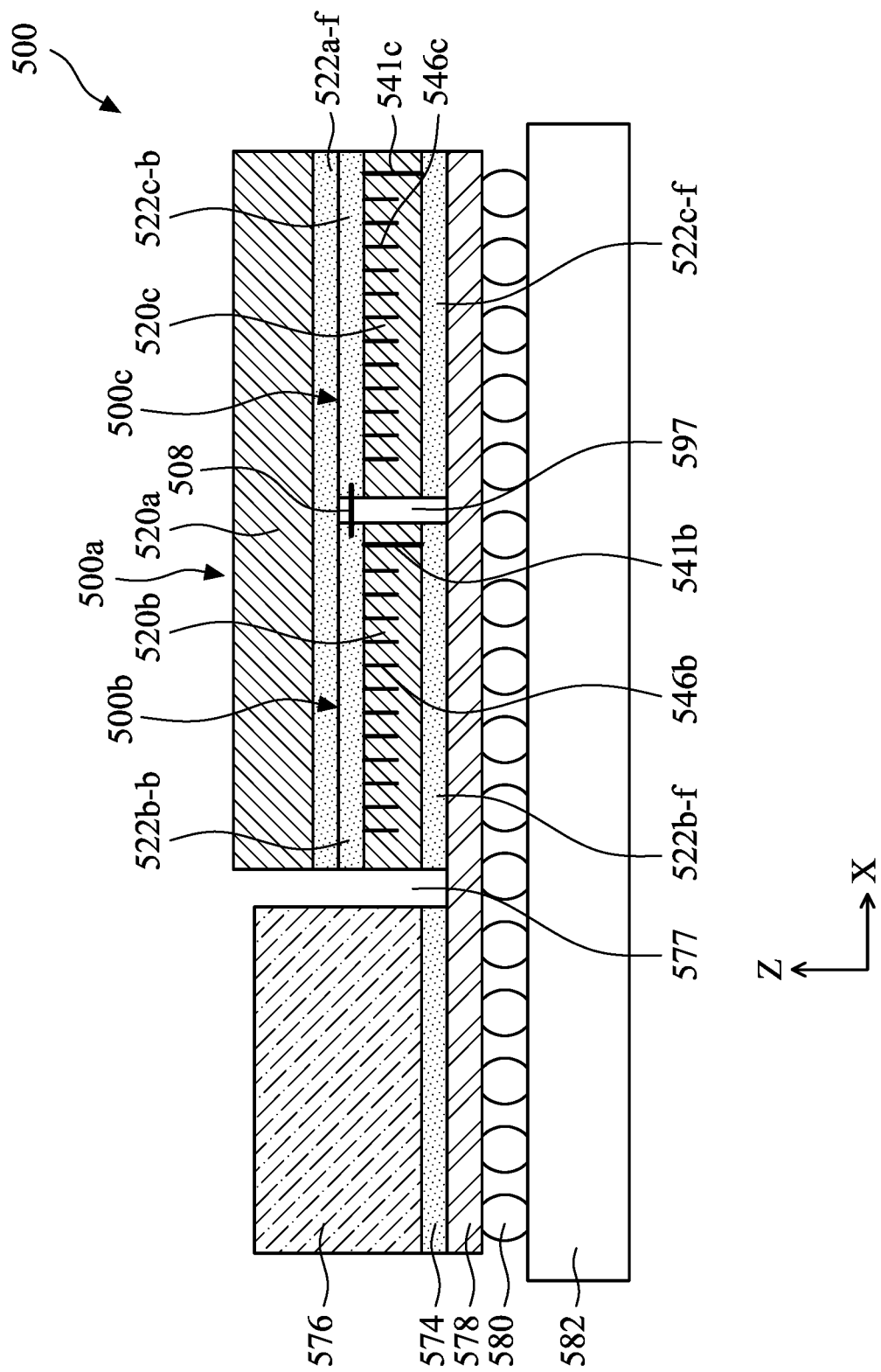
FIG. 5 schematically demonstrates a semiconductor package in accordance with some embodiments.

FIG. 5 schematically demonstrates a semiconductor package 500 in accordance with some embodiments. As shown in FIG. 5, an integrated circuit die 500a is disposed over integrated circuit dies 500b and 500c. The integrated circuit dies 500a, 500b, 500c may be any of the integrated circuit dies 100a, 100b, 100c discussed above. The integrated circuit dies 500b, 500c each have an interconnect structure 522b-f, 522c-f disposed on a first side (e.g., front side) of a device layer 520b, 520c, respectively. The integrated circuit dies 500b, 500c each have a backside interconnect structure 522b-b, 522c-b disposed on a second side (e.g., back side) of the device layer 520b, 520c, respectively. The integrated circuit die 500a has an interconnect structure 522a-f provided on a first side (e.g., front side) of a device layer 520a. The interconnect structure 522a-f of the integrated circuit die 500a is in direct contact with the backside interconnect structure 522b-b, 522c-b of the integrated circuit dies 500b and 500c through the hybrid bonding technique. Similar to the backside power rails 446, each of the integrated circuit dies 500b and 500c has one or more backside power rails 546b, 546c formed on the back side of the device layers 520b, 520c, respectively. Each of the integrated circuit dies 500b and 500c further has one or more power lines 541b, 541c connecting the interconnect structure 522b-f, 522c-f to the backside interconnect structure 522b-b, 522c-b, respectively. The integrated circuit dies 500b, 500c may be separated from each other by a gap 597. The semiconductor package 500 also includes edge interconnect features 508, such as the edge interconnect features 108a-108c, provided at the edge of the backside interconnect structures 522b-b, 522c-b to provide internal connections between or among the integrated circuit dies 500a and 500b. Additionally or alternatively, the edge interconnect features 508 may be provided at the interconnect structures 522b-f, 522c-f.

The semiconductor package 500 further includes a RDL 578, such as the RDL 478, in contact with the interconnect structure 522b-f, 522c-f of the integrated circuit dies 500b and 500c. An integrated circuit die 576, such as the integrated circuit die 476, is disposed adjacent and separated from the integrated circuit dies 500a, 500b by a gap 577. In some embodiments, the integrated circuit dies 500a, 500b, 500c are SOCs and the integrated circuit die 576 is a memory die. The integrated circuit die 576 has an interconnect structure 574 in contact with the RDL 578. External contacts 580, such as the external contacts 480, are formed on a side of the RDL 578 to provide external connection from a PCB 582 to the integrated circuit dies 500b, 500c and the integrated circuit die 576. The power lines 541b, 541c, the interconnect structure 522b-f, 522c-f, the backside interconnect structures 522b-b, 522c-b, and the interconnect structure 522a-f provide direct connection between the integrated circuit dies 500b, 500c and the integrated circuit die 500a. The integrated circuit die 576 and devices in the integrated circuit dies 500b, 500c can be directly powered through the backside power rails 546b, 546c and power lines 541b, 541c. The semiconductor package 500 may be suitable for those require high power or high-performance computing (HPC) applications.

Figure 6:
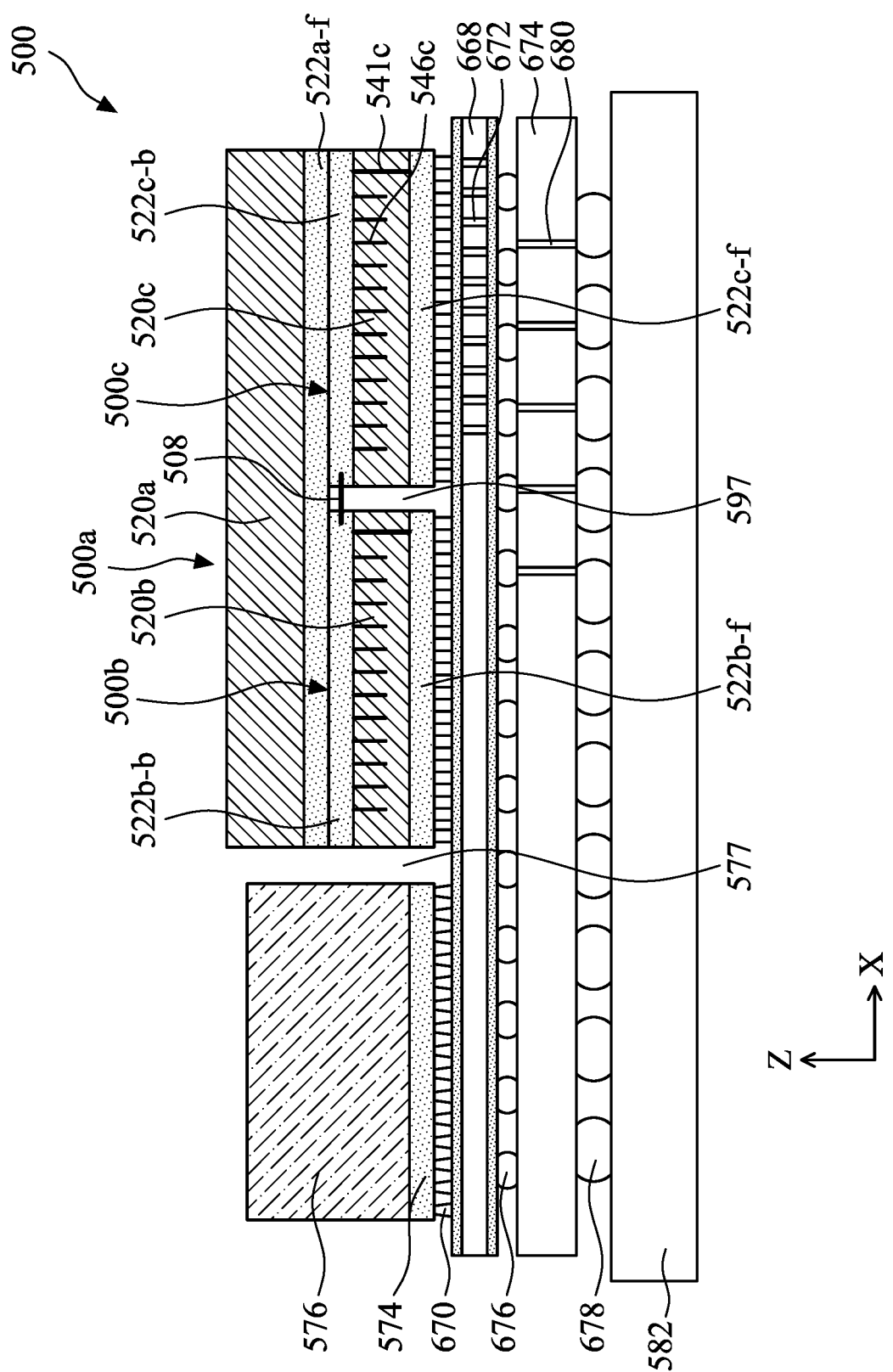
FIG. 6 schematically demonstrates a semiconductor package in accordance with some embodiments.

FIG. 6 schematically demonstrates a semiconductor package 600 in accordance with some embodiments. The semiconductor package 600 is similar to the semiconductor package 500 except that the RDL 578 in the semiconductor package 600 is replaced by one or more interposer substrates. In FIG. 6, the interconnect structure 522b-f, 522c-f of the integrated circuit dies 520b, 520c and the interconnect structure 574 of the integrated circuit die 576 are connected to a first interposer substrate 618 through a first set of external contacts 670, such as the external contacts 580. The first interposer substrate 668 may include various embedded interconnections 672, which may provide routes from the first set of external contacts 670 to a second interposer substrate 674 through a second set of external contacts 676. The second interposer substrate 674 is disposed below the first interposer substrate 668 and may include embedded interconnections 680. The embedded interconnections 680 provide routes to external circuits, such as a PCB 582, through a third set of external contacts 678. The power lines 541b, 541c, the interconnect structure 522b-f, 522c-f, the backside interconnect structures 522b-b, 522c-b, and the interconnect structure 522a-f provide direct connection between the integrated circuit dies 500b, 500c and the integrated circuit die 500a. The integrated circuit die 576 and devices in the integrated circuit dies 500b, 500c can be directly powered through the backside power rails 546b, 546c and power lines 541b, 541c. The semiconductor package 600 also includes edge interconnect features 508 at the edge of the backside interconnect structures 522b-b, 522c-b to provide internal connections between or among the integrated circuit dies 500a and 500b. Additionally or alternatively, the edge interconnect features 508 may be provided at the interconnect structures 522b-f, 522c-f. The semiconductor package 600 may be suitable for those require high power or HPC applications.

Embodiments of the present disclosure provide a stacking edge interconnect chiplet in which an integrated circuit die is directly connected to one or more integrated circuit dies via hybrid bonding of interconnect structures of the integrated circuit dies. The integrated circuit dies are powered using power lines extending through the one or more integrated circuit dies and backside power rails disposed on the back side of the one or more integrated circuit dies. Having power rails provided on the back side saves an amount of routing resources used on the front side of one or more integrated circuit dies, and reduces BEOL process complexity without abnormal electrical mis-connection issues. In some embodiments, at least one integrated circuit die has edge interconnect features extending from one or more IMD layers across a scribe line to another integrated circuit die, thereby providing direct connection between the integrated circuit dies. The direct connection between different integrated circuit dies reduces interposer layers, redistribution process, and bumping processes in multi-die integration, thus, reducing cost of manufacturing. The edge interconnect features enable signal/power to be directly transferred therethrough, instead of going through interposer substrates, or PCBs, thus achieve higher performance. The edge interconnect features, connected to one or more IMD layers, also enables higher routing density than through an interposer. The edge interconnect features design may be easily adopted from one integrated circuit die to another, thus, provide high feasibility and flexibility for designers.

In one embodiment, a semiconductor package is provided. The semiconductor device includes a first integrated circuit die comprising a first device layer having a first side and a second side opposite the first side, a first interconnect structure disposed on the first side of the first device layer, and a second interconnect structure disposed on the second side of the first device layer. The semiconductor device also includes a power line extending through the first device layer and in contact with the first interconnect structure and the second interconnect structure, and a second integrated circuit die disposed over the first integrated circuit die, the second integrated circuit die comprising a third interconnect structure in contact with the second interconnect structure of the first integrated circuit die.

In another embodiment, a semiconductor package is provided. The semiconductor device includes a first integrated circuit die having a first side and a second side opposite the first side, the first integrated circuit die comprising a first source/drain, a first interconnect structure disposed on the first side of the first integrated circuit die, a second interconnect structure disposed on the second side of the first integrated circuit die, and a first power rail extending between the first source/drain and the second interconnect structure. The semiconductor device also includes a second integrated circuit die having a first side and a second side opposite the first side of the second integrated circuit die, the second integrated circuit die disposed adjacent the first integrated circuit die. The second integrated circuit die comprises a second source/drain, a third interconnect structure disposed on the first side of the second integrated circuit die, a fourth interconnect structure disposed on the second side of the second integrated circuit die, and a second power rail extending between the second source/drain and the fourth interconnect structure, an edge interconnect feature having a first end contacting the second interconnect structure and a second end contacting the fourth interconnect structure. The semiconductor device further includes a third integrated circuit die disposed over the first and second integrated circuit dies, and the third integrated circuit die comprises a fifth interconnect structure in contact with the second and fourth interconnect structures.

In yet another embodiment, a semiconductor package is provided. The semiconductor device includes a first integrated circuit die comprising a front side interconnect structure and a backside interconnect structure, a second integrated circuit die comprising a front side interconnect structure and a backside interconnect structure, a third integrated circuit die comprising an interconnect structure, wherein the interconnect structure being in contact with the front side interconnect structures of the first and second integrated circuit dies. The semiconductor device also includes a seal region surrounding the first integrated circuit die, and a plurality of edge interconnect features extending through the seal region, wherein each edge interconnect feature has a first end contacting the front side interconnect structure of the first integrated circuit die and a second end contacting the front side interconnect structure of the second integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor package, comprising:
    a first integrated circuit die comprising:
        a first device layer having a first side and a second side opposite the first side;
        a first interconnect structure disposed on the first side of the first device layer; and
        a second interconnect structure disposed on the second side of the first device layer;
    a power line extending through the first device layer and in contact with the first interconnect structure and the second interconnect structure; and
    a second integrated circuit die disposed over the first integrated circuit die, the second integrated circuit die comprising:
        a third interconnect structure in contact with the second interconnect structure of the first integrated circuit die.

2. The semiconductor device of claim 1, further comprising:
    a third integrated circuit die disposed adjacent the first integrated circuit die, the third integrated circuit die comprising:
        a second device layer having a first side and a second side opposite the first side of the second device layer;
        a fourth interconnect structure disposed on the first side of the second device layer; and
        a fifth interconnect structure disposed on the second side of the second device layer, the fifth interconnect structure being in contact with the third interconnect structure.

3. The semiconductor device of claim 2, further comprising:
    an edge interconnect feature extending between the first integrated circuit and the third integrated circuit die, wherein the edge interconnect feature has a first end contacting the first interconnect structure and a second end contacting the fourth interconnect structure.

4. The semiconductor device of claim 2, further comprising:
    an edge interconnect feature extending between the first integrated circuit and the third integrated circuit die, wherein the edge interconnect feature has a first end contacting the second interconnect structure and a second end contacting the fifth interconnect structure.

5. The semiconductor device of claim 2, further comprising:

a redistribution layer in contact with the first and fourth interconnect structures.

6. The semiconductor device of claim 5, further comprising:
a fourth integrated circuit die disposed adjacent the third integrated circuit die, the fourth integrated circuit die comprising:
a sixth interconnect structure in contact with the redistribution layer.

7. The semiconductor device of claim 2, wherein the first device layer further comprises:
one or more power rails disposed on the second side of the first device layer.

8. The semiconductor device of claim 7, wherein the first device layer further comprises:
a gate structure;
a first source/drain disposed on a first side of the gate structure; and
a first silicide layer disposed between and in contact with the first source/drain and the one or more power rails.

9. The semiconductor device of claim 8, further comprising:
a plurality of semiconductor layers in contact with the first source/drain; and
a gate electrode layer surrounding each semiconductor layer of the plurality of semiconductor layers.

10. The semiconductor device of claim 9, further comprising:
a second source/drain disposed on a second side of the gate structure opposite the first source/drain;
a source/drain contact in contact with the first interconnect structure; and
a second silicide layer disposed between and in contact with the source/drain contact and the second source/drain.

11. A semiconductor package, comprising:
a first integrated circuit die, comprising:
a first device layer having a first side and a second side opposite the first side;
a first interconnect structure disposed on the first side of the first device layer;
a second interconnect structure disposed on the second side of the first device layer; and
a first power rail extending through the first device layer and in contact with the first and second interconnect structures;
a second integrated circuit die disposed adjacent the first integrated circuit die, comprising:
a second device layer having a first side and a second side opposite the first side of the second device layer;
a third interconnect structure disposed on the first side of the second device layer;
a fourth interconnect structure disposed on the second side of the second device layer; and
a second power rail extending through the second device layer and in contact with the third and fourth interconnect structures; and
a plurality of edge interconnect features each having a first end contacting the first interconnect structure and a second end contacting the third interconnect structure.

12. The semiconductor package of claim 11, further comprising:

a third integrated circuit die disposed over the first and second integrated circuit dies, comprising:
a fifth interconnect structure in contact with the second and fourth interconnect structures of the first and second integrated circuit dies, respectively.

13. The semiconductor package of claim 11, wherein the plurality of edge interconnect features are symmetrically arranged around the first and second integrated circuit dies.

14. The semiconductor package of claim 11, further comprising:
one or more first power rails disposed in the first device layer.

15. The semiconductor package of claim 14, wherein at least one first power rail is disposed between and connected to the second interconnect structure and a source/drain feature of the first device layer.

16. The semiconductor package of claim 15, further comprising:
one or more second power rails disposed in the second device layer, wherein at least one second power rail is disposed between and connected to the fourth interconnect structure and a source/drain feature of the second device layer.

17. A semiconductor package, comprising:
a first integrated circuit die comprising a first interconnect structure;
a second integrated circuit die, comprising:
a first device layer;
a second interconnect structure disposed on a first side of the first device layer; and
a third interconnect structure disposed on a second side of the first device layer and in contact with the first interconnect structure;
a third integrated circuit die, comprising:
a second device layer;
a fourth interconnect structure disposed on a first side of the second device layer; and
a fifth interconnect structure disposed on a second side of the second device layer and in contact with the first interconnect structure; and
a plurality of edge interconnect features each is disposed between and in contact with the second interconnect structure and fourth interconnect structure.

18. The semiconductor package of claim 17, further comprising:
a first power rail extending through the first device layer to connect the first interconnect structure to the second interconnect structure; and
a second power rail extending through the second device layer to contact the third interconnect structure to the fourth interconnect structure.

19. The semiconductor package of claim 18, wherein the third interconnect structure and the fifth interconnect structure are separated from each other by a gap.

20. The semiconductor package of claim 18, further comprising:
one or more power rails disposed in the first device layer, wherein at least one power rail is disposed between the third interconnect structure and a source/drain feature of the first device layer.

* * * * *